US012068746B2

(12) United States Patent
Lim et al.

(10) Patent No.: US 12,068,746 B2
(45) Date of Patent: Aug. 20, 2024

(54) MAGNETIC LOGIC DEVICE, CIRCUIT HAVING MAGNETIC LOGIC DEVICES, AND METHODS FOR CONTROLLING THE MAGNETIC LOGIC DEVICE AND THE CIRCUIT

(71) Applicant: Nanyang Technological University, Singapore (SG)

(72) Inventors: Chu Keong Gerard Joseph Lim, Singapore (SG); Chandrasekhar Murapaka, Singapore (SG); Wen Siang Lew, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 212 days.

(21) Appl. No.: 17/773,945

(22) PCT Filed: Nov. 2, 2020

(86) PCT No.: PCT/SG2020/050626
§ 371 (c)(1),
(2) Date: May 3, 2022

(87) PCT Pub. No.: WO2021/091484
PCT Pub. Date: May 14, 2021

(65) Prior Publication Data
US 2022/0385292 A1    Dec. 1, 2022

(30) Foreign Application Priority Data
Nov. 5, 2019  (SG) .......................... 10201910275V

(51) Int. Cl.
*G11C 11/16*    (2006.01)
*G11C 11/18*    (2006.01)
(Continued)

(52) U.S. Cl.
CPC ............ *H03K 19/18* (2013.01); *G11C 11/161* (2013.01); *G11C 11/1673* (2013.01);
(Continued)

(58) Field of Classification Search
CPC ......... G11C 11/18; G11C 11/15; G11C 11/16; G11C 11/5607; G11C 19/0808;
(Continued)

(56) References Cited

U.S. PATENT DOCUMENTS

| 8,354,861 B2 * | 1/2013 | Sugibayashi ....... G11C 11/1675 365/158 |
| 10,333,523 B2 * | 6/2019 | Manipatruni .......... H03K 19/18 |

(Continued)

FOREIGN PATENT DOCUMENTS

WO    2018112889    6/2018

OTHER PUBLICATIONS

Kim, N.S., et al., " Leakage Current: Moore's Law Meets Static Power ", Computer, 2003, 36, pp. 68-75.
(Continued)

*Primary Examiner* — Kurtis R Bahr
(74) *Attorney, Agent, or Firm* — Womble Bond Dickinson (US) LLP

(57) ABSTRACT

A magnetic logic device having two magnetic elements and a conductive element coupled to the two magnetic elements and arranged at least substantially perpendicular to the magnetic elements, wherein the device is configured, for each magnetic element, to have a magnetisation state with a perpendicular easy axis, and to switch the magnetisation state in response to a spin current generated in the magnetic element in response to a write current applied to the magnetic element, and configured to generate, as an output, a Hall voltage across the conductive element in response to a respective read current applied to each magnetic element,
(Continued)

wherein a magnitude of the Hall voltage is variable, depending on a direction of the magnetisation state of each magnetic element and a direction of the respective read current applied to each magnetic element, for the device to provide outputs corresponding to one of a plurality of logical operations.

20 Claims, 13 Drawing Sheets

(51) Int. Cl.
    *H03K 19/18*     (2006.01)
    *H03K 19/21*     (2006.01)
    *H10N 52/00*     (2023.01)

(52) U.S. Cl.
    CPC .......... *G11C 11/1675* (2013.01); *G11C 11/18* (2013.01); *H03K 19/21* (2013.01); *H10N 52/00* (2023.02)

(58) Field of Classification Search
    CPC ........ H03K 19/18; H03K 19/16; H03K 19/20; H03K 19/21; H03K 17/90; H03K 19/195; H03K 19/1776; H03K 19/173
    See application file for complete search history.

(56) References Cited

U.S. PATENT DOCUMENTS

| | | | |
|---|---|---|---|
| 10,447,277 B1* | 10/2019 | Kazemi | ............... H10N 50/80 |
| 10,897,364 B2* | 1/2021 | De | ............... H04L 9/3278 |
| 10,978,121 B2* | 4/2021 | Wang | ............... G11C 11/161 |
| 2008/0151615 A1 | 6/2008 | Rodmacq et al. | |
| 2011/0292718 A1 | 12/2011 | Suzuki et al. | |
| 2018/0114557 A1 | 4/2018 | Park et al. | |
| 2020/0211609 A1* | 7/2020 | Wang | ............... G11C 11/161 |

OTHER PUBLICATIONS

Ikeda, S., et al., "A perpendicular-anisotropy CoFeB—MgO magnetic tunnel junction", Nat. Mater., 2010, 9, pp. 721-724.
Huang, K.-F., et al., "Engineering spin-orbit torque in Co/Pt multilayers with perpendicular magnetic anisotropy", Appl. Phys. Lett., 2015, 107, 232407.
Mittal, S., et al., "Addressing Read-Disturbance Issue in STT-RAM by Data Compression and Selective Duplication" IEEE Comput. Archit. Lett., 2017, 16, pp. 94-98.
Kang, W., et al., "Readability Challenges in Deeply Scaled STT-MRAM" 2014 14th Annual Non-Volatile Memory Technology Symposium (NVMTS), 2014.
Li, S., et al., "Deterministic Spin—Orbit Torque Induced Magnetization Reversal In Pt/[Co/Ni]n/Co/Ta Multilayer Hall Bars", Scl. Rep., 2017, 7, 972.
Cubukcu, M., et al., "Ultra-Fast Perpendicular Spin-Orbit Torque MRAM", IEEE Trans, Magn., 2018, 54, 9300204.
Shi, S., et al., "Fast Low-Current Spin-Orbit-Torque Switching of Magnetic Tunnel Junctions through Atomic Modifications of the Free-Layer Interfaces", Phys. Rev. Appl., 2018, 9, 011002.
S. Fukami, et al., "A spin-orbit torque switching scheme with collinear magnetic easy axis and current configuration", Nat. Nanotechnol. 11, pp. 621-626, 2016, 11, 621.
Liu, L., et al., "Current-Induced Switching of Perpendicularly Magnetized Magnetic Layers Using Spin Torque from the Spin Hall Effect", Phys. Rev. Lett., 2012, 109, 096602.
Oh, Y.-W., et al., "Field-free switching of perpendicular magnetization through spin-orbit torque in antiferromagnet/ferromagnet/oxide structures", Nat. Nanotechnol., 2016, 11, pp. 878-885.
S. Fukami, at al., "Magnetization switching by spin-orbit torque in an antiferromagnet-ferromagnet bilayer system", Nat. Mater. 15, pp. 535-542, 2016.
Omari, K.A., et al., "Chirality-Based Vortex Domain-Wall Logic Gates", Phys. Rev. Appl., 2014, 2, 044001.
Hung, Y.-M., et al., "Domain wall fringe field coupled spin logic", AIP Adv., 2016, 6, 125118.
Zhang, H., et al., "Spintronic Processing Unit in Spin Transfer Torque Magnetic Random Access Memory", IEEE Trans. Electron Devices, 2019, 66, pp. 2017-2022.
Bae, G. Y., et al., "Reconfigurable logic for carry-out computing in 1-bit full adder using a single magnetic tunnel junction", Solid-State Electron., 2019, 154, pp. 16-19.
Wan, C., et al., "Programmable Spin Logic Based on Spin Hall Effect in a Single Device", Advanced Electronic Materials, 2017, 3, 1600282.
Baek, S.-h.C., et al., "Complementary logic operation based on electric-field controlled spin-orbit torques", Nature Electronics, 2018, 1, pp. 398-403.
Jaiswal, A., et al., "A Non-volatile Cascadable Magneto-electric Material Implication Logic", in 2017 75th Annual Device Research Conference (DRC), 2017.
Roohi, A., et al., "Voltage-Based Concatenatable Full Adder Using Spin Hall Effect Switching", IEEE Trans. Comput.-Aided Des. Integr. Circuits Syst., 2017, 36, pp. 2134-2138.
Camsari, K.Y., et al., "Modular Approach to Spintronics", Nature Scientific Reports, 2015, 5:10571, pp. 1-13.
Hong, S., et al., "Spin Circuit Representation for the Spin Hall Effect", IEEE Transactions on Nanotechnology, 2016, 15, pp. 225-236.
Chen, Y.-T., et al., "Theory of spin Hall magnetoresistance", Phys. Rev. B, 2013, 87, 144411.
Bonhomme, P., et al., "Circuit Simulation of Magnetization Dynamics and Spin Transport", IEEE Trans. Electron Devices, 2014, 61, pp. 1553-1560.
Panagopoulos, G.D., et al., "Physics-Based SPICE-Compatible Compact Model for Simulating Hybrid MTJ/CMOS Circuits", IEEE Trans. Electron Devices, 2013, 60, pp. 2808-2814.
Nagaosa, N., et al., "Anomalous Hall effect", Revs. Mod. Phys., 2010, 82, pp. 1539-1592.
T. Liu, et al., "Extraordinary Hall effect based magnetic logic applications", Appl. Phys. Lett., 2015, 106, 052406.
G.J. Lim, et al., "Programmable Spin-Orbit-Torque Logic Device with Integrated Bipolar Bias Field for Chirality Control", Adv. Electron. Mater., 2020, 6, 1901090.

\* cited by examiner

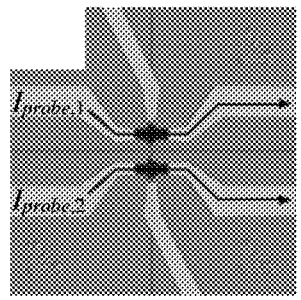 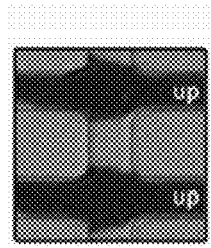

| $I_{probe,1}$ | $I_{probe,2}$ | $V_H$ | Half Rectification | Full Rectification |
|---|---|---|---|---|
| | | Up-Up | | |
| T | T | +200μV | T | T |
| T | F | 0 | F | F |
| F | T | 0 | F | F |
| F | F | −200μV | F | T |
| | | | AND | XNOR |

FIG. 7A

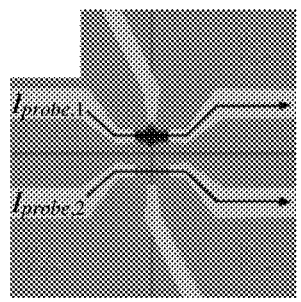 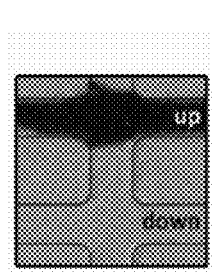

| $I_{probe,1}$ | $I_{probe,2}$ | $V_H$ | Half Rectification | Full Rectification |
|---|---|---|---|---|
| | | Up-Down | | |
| T | T | 0 | F | F |
| T | F | +200μV | T | T |
| F | T | −200μV | F | T |
| F | F | 0 | F | F |
| | | | NIMP | XOR |

FIG. 7B

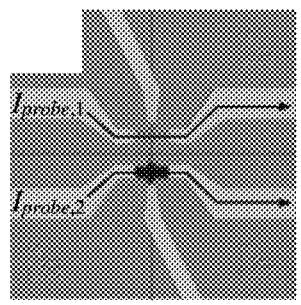 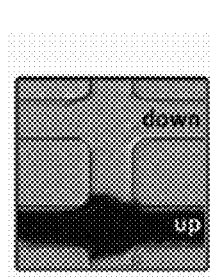

| $I_{probe,1}$ | $I_{probe,2}$ | $V_H$ | Half Rectification | Full Rectification |
|---|---|---|---|---|
| | | Down-Up | | |
| T | T | 0 | F | F |
| T | F | −200μV | F | T |
| F | T | +200μV | T | T |
| F | F | 0 | F | F |
| | | | Converse NIMP | XOR |

FIG. 7C

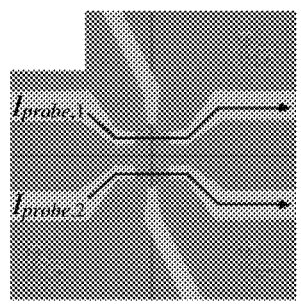 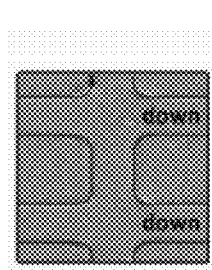

| $I_{probe,1}$ | $I_{probe,2}$ | $V_H$ | Half Rectification | Full Rectification |
|---|---|---|---|---|
| | | Down-Down | | |
| T | T | −200μV | F | T |
| T | F | 0 | F | F |
| F | T | 0 | F | F |
| F | F | +200μV | T | T |
| | | | NOR | XNOR |

FIG. 7D

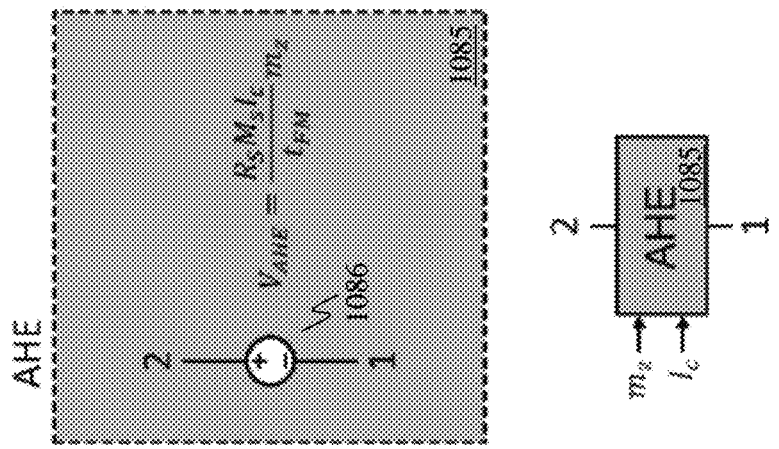
FIG. 10C
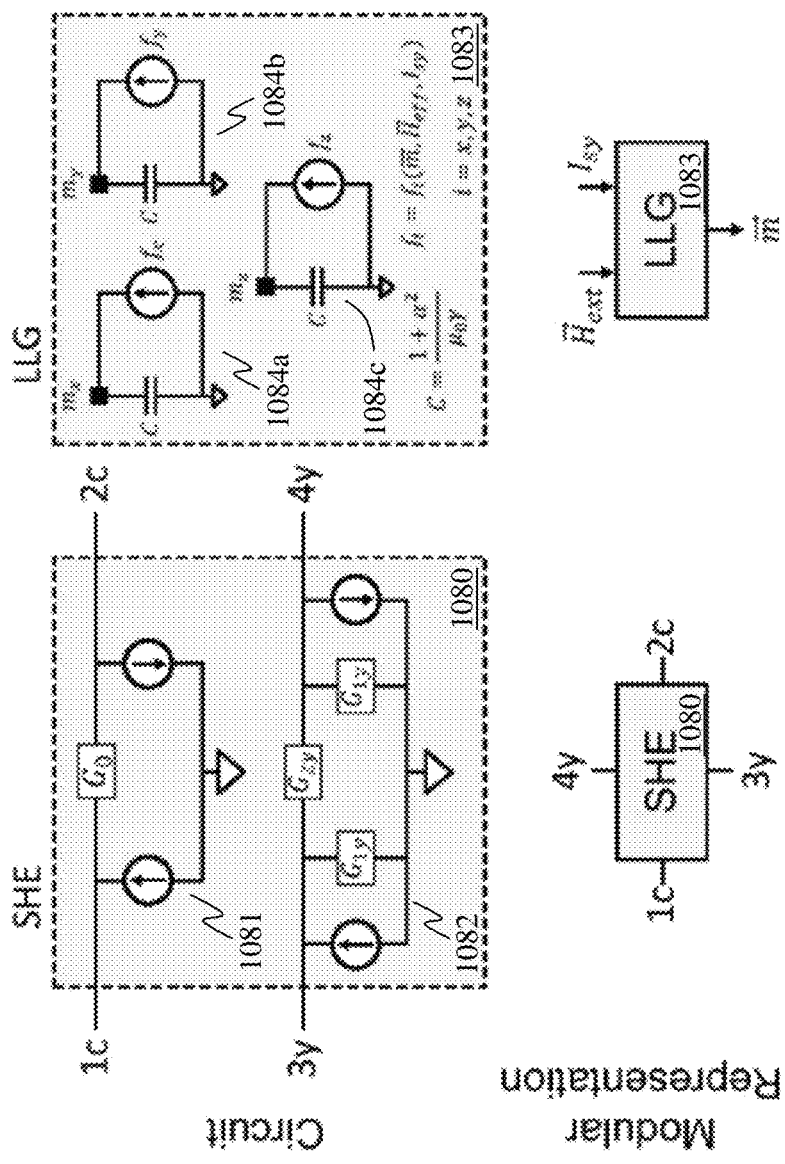
FIG. 10B
FIG. 10A

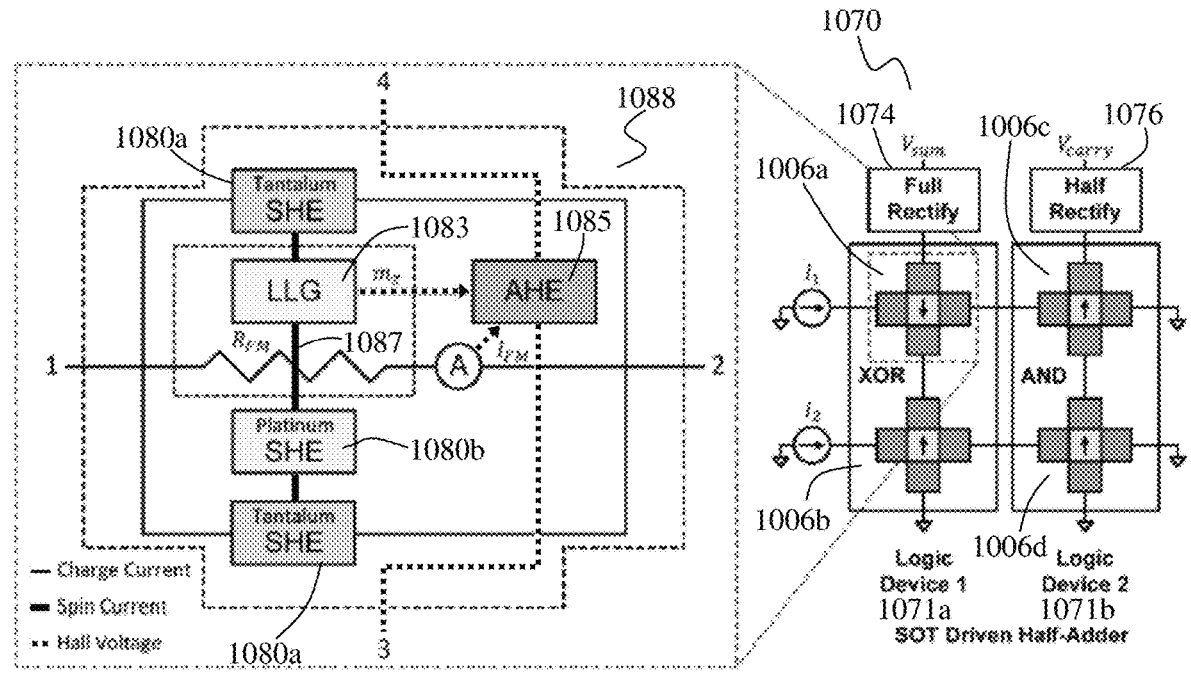
FIG. 10D
FIG. 10E
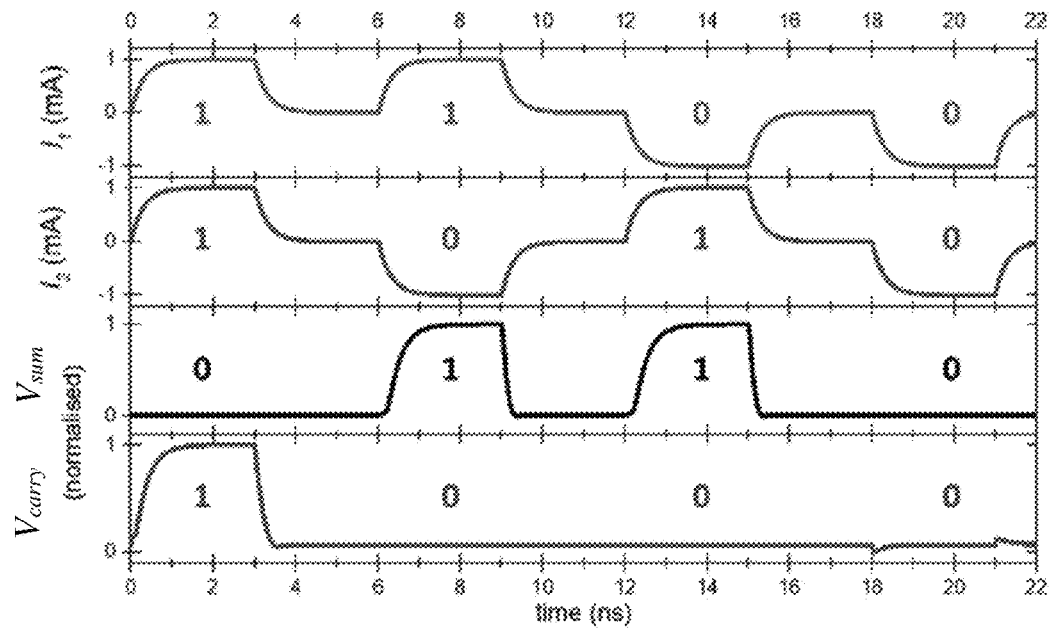
FIG. 10F

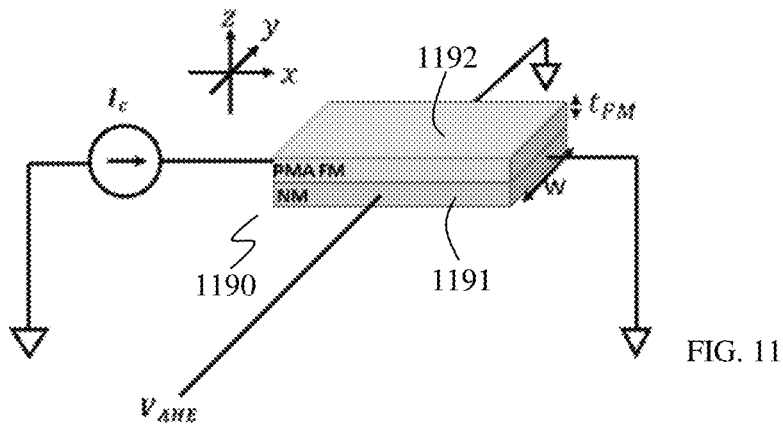

FIG. 11

| Module | Quantity | Value |
|---|---|---|
| Pt SHE | Spin Hall Angle, $\theta_{Pt}$ | $0.10 \pm 0.01$ |
| | Spin Diffusion Length, $\lambda_{Pt}$ | 7.3 nm |
| | Conductivity, $\sigma_{Pt}$ | $2.08 \times 10^6\ \Omega^{-1} m^{-1}$ |
| | Thickness, $t_{Pt}$ | 5.0 nm |
| | Area, $A$ | $5\ \mu m \times 3\ \mu m$ |
| Ta SHE | Spin Hall Angle, $\theta_{Ta}$ | $-0.071 \pm 0.006$ |
| | Spin Diffusion Length, $\lambda_{Ta}$ | 1.9 nm |
| | Conductivity, $\sigma_{Ta}$ | $3.45 \times 10^5\ \Omega^{-1} m^{-1}$ |
| | Thickness, $t_{Ta}$ | 5.0 nm |
| | Area, $A$ | $5\ \mu m \times 3\ \mu m$ |
| FM LLG | Saturation Magnetization, $M_s$ | $6.75 \times 10^5\ Am^{-1}$ |
| | Anisotropy Field, $\mu_0 H_K$ | 1 T |
| | Volume, $V$ | $5\ \mu m \times 3\ \mu m \times 4.2\ nm$ |
| | Gilbert Damping, $\alpha$ | 0.02 |
| Resistance of FM Layer | Resistivity of Cobalt, $\rho_{Co}$ | $3.0 \times 10^{-6}\ \Omega m$ |
| | Resistivity of Platinum, $\rho_{Pt}$ | $4.8 \times 10^{-7}\ \Omega m$ |
| | Length, $l$ | $3.0\ \mu m$ |
| | Sheet cross-sectional Area, $A$ | $5.0\ \mu m \times 0.6\ nm$ |
| | Effective Resistance, $R_{FM}$ | $159.7\ \Omega$ |
| AHE | Saturation Magnetization, $M_s$ | $6.75 \times 10^5\ Am^{-1}$ |
| | AHE Coefficient, $R_s$ | $1.48 \times 10^{-14}\ \Omega m^2 A$ |
| | Thickness of FM layer, $t_{FM}$ | 4.2 nm |

FIG. 12

MAGNETIC LOGIC DEVICE, CIRCUIT HAVING MAGNETIC LOGIC DEVICES, AND METHODS FOR CONTROLLING THE MAGNETIC LOGIC DEVICE AND THE CIRCUIT

CROSS-REFERENCE TO RELATED APPLICATION

This application is a national stage filing under 35 U.S.C. 371 of PCT/SG2020/050626, filed Nov. 2, 2020, which International Application was published by the International Bureau in English on May 14, 2021, as WO 2021/091484, which claims the benefit of priority of Singapore patent application No. 10201910275V, filed Nov. 5, 2019, which applications are hereby incorporated in their entirety by reference in this application.

TECHNICAL FIELD

Various embodiments relate to a magnetic logic device, a method for controlling the magnetic logic device, a circuit having magnetic logic devices and method for controlling the circuit.

BACKGROUND

Known microelectronic devices such as CMOS (complementary metal-oxide-semiconductor) transistors work based on the accumulation and dissipation of charge which is mediated by the flow of electrons across a conducting channel. However, the electrons possess another degree of freedom—quantum mechanical angular momentum called "spin". Unlike charge, spin can have two orientations, +½ and -½, and each can be represented as a binary bit. Devices that explore the spin property of electrons along with charge are known as spintronic devices. The spin state (magnetic state) of a spintronic device such as a nanomagnet can be determined through magnetoresistance and anomalous Hall effect measurements. The former is a measure of resistance due to the scattering of polarised electrons through regions of varying magnetisation, while the latter can be measured as a voltage drop formed due to imbalanced deflection of spin polarised electrons. The unique property that makes spintronic devices attractive is non-volatility, resulting in zero quiescent power, thus reducing power consumption. Though spintronic-based memory devices such as hard disc drives have been very successful, logic and computational operations performed by processing units are still dependent on microelectronic circuits. This leads to relatively higher power consumption due to resistive heating caused in part by periodic memory refresh (due to volatility), as well as data transfer. As devices continue to shrink in size, this effect becomes more pronounced. Moreover, the transfer of electronic data between different levels of memory in memory hierarchy leads to latency.

The spin degree of freedom has enabled the development of non-volatile, high-speed, ultra-low energy dissipation, and scalable spin-based sensors and memory devices. These devices utilize the spin property of the electron rather than relying on electronic charge alone as a state variable, and address device level issues such as high dynamic and standby power dissipation due to leakage current, and heat dissipation inherent to known silicon-based complementary metal-oxide-semiconductor (CMOS) technology. The spin-transfer torque Magnetic Random Access Memory (STT-MRAM) is one of the successful and commercially available spintronic products. Its inherent non-volatility, relatively high speed, low power dissipation, as well as quasi-infinite endurance make it an attractive alternative to transistor-based devices. As STT-MRAM devices scale progressively, read disturbance becomes a critical barrier to overcome. More recently, highly efficient current-induced switching techniques have been achieved in spin-based devices with large spin-orbit coupling (SOC) materials such as heavy metals (HM) Ta (tantalum) and Pt (platinum), allowing write and read current paths to be decoupled. By injecting an in-plane electrical current through a HM, spin polarised electrons accumulate at the interface of the HM/ferromagnet (FM). The transverse spin current exerts torque on the magnetisation of the FM layer, leading to deterministic spin-orbit torque (SOT) switching. For devices with perpendicular magnetic anisotropy (PMA), the polarity of a symmetry-breaking in-plane field parallel to the direction of current flow determines the chirality of SOT switching. In many cases, it may be advantageous to eliminate the use of external magnetic fields.

SUMMARY

The invention is defined in the independent claims. Further embodiments of the invention are defined in the dependent claims.

According to an embodiment, a magnetic logic device is provided. The magnetic logic device may include two magnetic elements, wherein the magnetic logic device is configured, for each of the two magnetic elements, to have a magnetisation state with a perpendicular easy axis, and configured to switch the magnetisation state in response to a spin current generated in the magnetic element in response to a write current applied to the magnetic element, and a conductive element coupled to the two magnetic elements and arranged at least substantially perpendicular to the two magnetic elements, wherein the magnetic logic device is configured to generate, as an output, a Hall voltage across the conductive element in response to a respective read current applied to each of the two magnetic elements, wherein a magnitude of the Hall voltage is variable, depending on a direction of the magnetisation state of each of the two magnetic elements and a direction of the respective read current applied to each of the two magnetic elements, for the magnetic logic device to provide outputs corresponding to one of a plurality of logical operations According to an embodiment, a circuit is provided. The circuit may include a first magnetic logic device and a second magnetic logic device electrically coupled to each other, wherein the first magnetic logic device is as described herein to provide the outputs corresponding to an XOR logical operation, and wherein the second magnetic logic device is as described herein to provide the outputs corresponding to an AND logical operation.

According to an embodiment, a method for controlling a magnetic logic device as described herein is provided. The method may include skewing the magnetisation state of each of the two magnetic elements away from the perpendicular easy axis for switching the magnetisation state, for each of the two magnetic elements, applying a write current to the magnetic element to generate a spin current in the magnetic element to switch the magnetisation state, and applying a respective read current to each of the two magnetic elements for the magnetic logic device to generate, as an output, a Hall voltage across the conductive element, wherein a magnitude of the Hall voltage is variable, depending on a direction of the magnetisation state of each of the two magnetic elements and a direction of the respective read current applied to each of the two magnetic elements, for the magnetic logic device to provide outputs corresponding to one of a plurality of logical operations.

According to an embodiment, a method for controlling a circuit is provided. The method may include operating a first magnetic logic device of the circuit according to the method as described herein to provide the outputs corresponding to an XOR logical operation, and operating a second magnetic logic device of the circuit according to the method as described herein to provide the outputs corresponding to an AND logical operation, wherein the first magnetic logic device and the second magnetic logic device are electrically coupled to each other.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 3B shows an optical micrograph of a logic device with the addition of a field line, while

FIG. 3D shows a schematic diagram for exchange bias of the perpendicularly-magnetized ferromagnetic (pFM) layer with an antiferromagnetic (AFM) layer, while

FIG. 3F shows a schematic diagram illustrating tuning of the magnetic properties of a perpendicular ferromagnetic (pFM) layer through voltage-controlled magnetic anisotropy (VCMA), while

FIGS. 7A to 7D show Kerr microscopy images and truth tables corresponding to the operation of the logic device of various embodiments.

FIGS. 10A to 10F show the SPICE-compatible compact model of a logic device and functional application as half-adder, according to various embodiments.

FIG. 11 shows a schematic diagram of a bilayer system having a normal metal (NM) layer and a ferromagnetic (FM) layer with perpendicular magnetic anisotropy (PMA).

FIG. 12 shows the parameters used in the SPICE-compatible compact model.

DETAILED DESCRIPTION

Figure 1A:
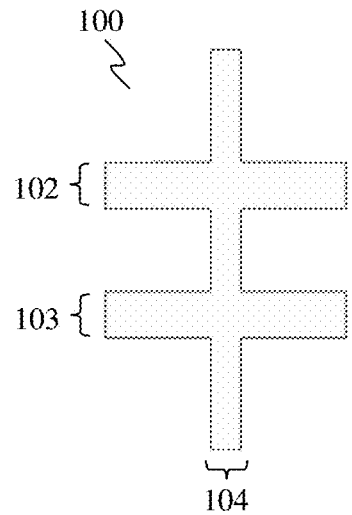
FIG. 1A shows a schematic top view of a magnetic logic device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

Various embodiments may provide a spin-orbit torque driven logic, including, for example, a programmable spin-orbit-torque logic device with integrated bipolar bias field for chirality control.

Apart from memory units as described above, spin-based devices also show potential in logic-in-memory applications. Techniques disclosed herein may provide one or more stateful SOT logic devices, with a balanced ternary output that may be employed to represent Boolean logic outputs. The Boolean logic outputs due to the logical inputs may be reconfigured by changing the device magnetisation and/or the read current scheme. Various embodiments may enable current-induced magnetisation switching (CIMS) with an integrated bias field line for the generation of a local Oersted field, effecting only the intended device and sparing adjacent devices from an external field otherwise provided by an electromagnet. This design may allow for on-the-fly reconfigurability by the switching chirality, and may not require initialization or reset current pulses that may increase write latency. The SOT-driven logic device of various embodiments may store and/or process data, and may serve as a reconfigurable spin-orbit torque driven nonvolatile logic-in-memory device.

Driven by the need to address both the von Neumann bottleneck and scaling limits predicted by Moore's law, spintronic devices have been shown to be strong contenders for logic-in-memory applications. While several field-free spin-orbit torque (SOT)-driven logic devices have been proposed, their operation typically requires additional initialization or reset pulses, the exchange-coupled canted spins may reduce both anomalous Hall sign-to-noise ratio as well as thermal stability of the ferromagnetic layer, and device-to-device variation in exchange coupling strength may be expected. A reconfigurable SOT-driven logic device using a double Hall cross structure with an integrated bias field line for the generation of a local bias field is disclosed herein. The on-chip bipolar bias field may be toggled to flip the SOT-induced switching chirality, and to assist with deterministic SOT magnetisation switching, thereby enabling on-the-fly reconfigurability of the logic device to function as one of several possible logic gates, e.g., AND, NOR, XNOR, XOR, NIMP, and converse NIMP. Through compact-modelling and circuit simulation, it is shown that the applications of such reconfigurable logic devices may be further expanded to build half-adders.

Various embodiments may provide a magnetic logic device driven by the spin-orbit torque (SOT) phenomenon. The logic functionalities may be achieved by connecting two Hall cross structures in series and sharing a common Hall bar. Though the underlying mechanism for logic operation may be related to spintronics, the device clocking may be achieved by current and output may be read from the voltage measured via the anomalous Hall effect. By connecting multiple devices, a programmable magnetic device driven by current may be achieved. In exploring the non-volatile parallel processing, a route towards spintronics-based computation is shown by designing a half-adder circuit, which may further be expanded to full-adder functionality.

Various embodiments may be related to binary computing driven by the spin-orbit torque phenomenon. A magnetic Hall cross structure is designed and disclosed herein, that may simultaneously perform multiple logic operations including but not limited to AND, NOR, XNOR, XOR, NIMP and/or Converse NIMP gate operations, thereby opening the avenue for both programmability (reconfigurable logic) and parallel processing.

FIG. 1A shows a schematic top view of a magnetic logic device 100, according to various embodiments. The magnetic logic device 100 includes two magnetic elements 102, 103, wherein the magnetic logic device 100 is configured, for each of the two magnetic elements 102, 103, to have a magnetisation state with a perpendicular easy axis, and configured to switch the magnetisation state in response to a spin current generated in the magnetic element 102, 103 in response to a write current applied to the magnetic element 102, 103, and a conductive element 104 coupled to the two magnetic elements 102, 103 and arranged at least substantially perpendicular to the two magnetic elements 102, 103, wherein the magnetic logic device 100 is configured to generate, as an output, a Hall voltage across the conductive element 104 in response to a respective read current applied to each of the two magnetic elements 102, 103, wherein a magnitude of the Hall voltage is variable, depending on a direction of the magnetisation state of each of the two magnetic elements 102, 103 and a direction of the respective read current applied to each of the two magnetic elements 102, 103, for the magnetic logic device 100 to provide outputs corresponding to one of a plurality of logical operations.

In other words, a magnetic logic device 100 having a first magnetic element 102, a second magnetic element 103, and a conductive element 104 arranged at least substantially perpendicular to the two magnetic elements 102, 103 may be provided. The conductive element 104 may be connected to or electrically coupled to the magnetic elements 102, 103. The conductive element 104 may be shared by the two magnetic elements 102, 103. The two magnetic elements 102, 103 and the conductive element 104 may define a structure having two crosses, as may be seen in FIG. 1A. The first magnetic element 102 and a first section of the conductive element 104 may define a first cross, while a second magnetic element 103 and a second section of the conductive element 104 may define a second cross. The two crosses may be connected in series. The two crosses may be symmetrical to one another.

The two magnetic elements 102, 103 may be arranged at least substantially parallel to each other. However, it should be appreciated that the two magnetic elements 102, 103 may be arranged in other directions relative to each other in a non-parallel manner. Each magnetic element 102, 103 may define a channel. Each magnetic element 102, 103 may be a nanowire.

In the context of various embodiments, each magnetic element 102, 103 may include a ferromagnetic (FM) material, e.g., in the form of a ferromagnetic (FM) layer. Each magnetic element 102, 103 may further include a heavy metal (HM) layer. The conductive element 104 may be magnetic or non-magnetic.

Each magnetic element 102, 103 may have or may be configured to have a magnetisation state with a perpendicular easy axis. This means that each magnetic element 102, 103 has perpendicular magnetisation anisotropy, e.g., each magnetic element 102, 103 may have perpendicular-magnetized ferromagnetic (pFM) material. This may mean that the direction of the magnetisation state (or magnetisation orientation) of the ferromagnetic layer of the magnetic element 102, 103 may be perpendicular to the plane of a major surface of the ferromagnetic layer. Further, this may mean that the magnetisation orientation of the ferromagnetic layer may be at least substantially parallel to a thickness direction of the ferromagnetic layer.

Each magnetic element 102, 103 may be configured to switch the magnetisation state in response to a spin current generated in the magnetic element 102, 103 in response to a write current that may be applied to the magnetic element 102, 103. The spin current may be generated in response to the write current due to spin orbit coupling (SOC). The magnetisation state of each magnetic element 102, 103 may be switched between an upwardly pointing direction and a downwardly pointing direction. The direction of the switch of the magnetisation state or the direction of the magnetisation state after the switch may depend on the polarity of the spin of the spin current, which, in turn, may depend on the polarity of the write current. As such, in a write operation, for each magnetic element 102, 103, different polarities of the write current may be applied to switch the magnetisation state of the corresponding magnetic element 102, 103.

The magnetic logic device 100 may generate, as an output, a Hall voltage (e.g., an anomalous Hall voltage) across (ends of) the conductive element 104 in response to a respective read current applied to each magnetic element 102, 103. As may be appreciated, the conductive element 104 may be a Hall conductive element, meaning that the conductive element 104 is capable of exhibiting Hall effect. A magnitude of the Hall voltage may be variable and dependent on a direction of the magnetisation state of each of the two magnetic elements 102, 103 and a direction of the respective read current applied to each of the two magnetic elements 102, 103. The respective read current (or probe or sense current) may be applied to each magnetic element 102, 103 in a read operation. For each magnetic element 102, 103, different polarities of the read current may be applied to the magnetic element 102, 103. Based on different combinations of the respective magnetisation states of the two magnetic elements 102, 103 and the respective read currents, the magnetic logic device 100 may provide outputs corresponding to one of a plurality of logical operations.

In various embodiments, a circuit may be electrically coupled to each of the two magnetic elements 102, 103 to supply the respective write and read currents. Write and read currents may be differentiated by their amplitudes. Write currents are generally larger in amplitude than read currents. Read currents are small enough not to perturb the magnetisation state of the device.

In one mode of operation, for each of the two magnetic elements 102, 103, the direction of the respective read current may be fixed, and the magnitude of the Hall voltage may be variable in response to a change in a direction of the write current applied to the magnetic element 102, 103 to change a polarity of the spin current to switch the magnetisation state.

In a further mode of operation, for each of the two magnetic elements 102, 103, the magnetisation state may be maintained (e.g., after the write operation or applying the write current once), and the magnitude of the Hall voltage may be variable in response to a change in the direction of the respective read current applied to the magnetic element 102, 103.

The magnetic logic device 100 may be configured to skew the magnetisation state of each of the two magnetic elements 102, 103 away from the perpendicular easy axis for the magnetic element 102, 103 to switch the magnetisation state in response to the spin current.

The magnetic logic device 100 may be configured to skew the magnetisation state by generating a magnetic field across the two magnetic elements 102, 103 using an electromagnet. Such an approach may provide a global field.

The magnetic logic device 100 may be configured to skew the magnetisation state by disposing a conductive field bias line adjacent to the two magnetic elements 102, 103, and the magnetic logic device 100 may be configured for the conductive field bias line to generate an Oersted field to interact with the two magnetic elements 102, 103. Such an approach may provide a local field to the magnetic elements 102, 103. The Oersted field may be generated by the conductive field bias line in response to a field current applied to the conductive field bias line. The conductive field bias line is electrically isolated from the two magnetic elements 102, 103.

The direction of the Oersted field (or field lines) may be dependent on and variable according to a direction of the field current. The Oersted field may be aligned coaxial to the write current(s) and/or the read current(s). The Oersted field may be parallel to or anti-parallel to the direction of the write current(s) and/or the read current(s).

For each of the two magnetic elements 102, 103, the magnetic element 102, 103 may switch the magnetisation state in response to the spin current and the Oersted field, wherein the direction of the magnetisation state after switching may be dependent on a polarity of the write current and a direction of the Oersted field.

In various embodiments, each of the two magnetic elements 102, 103 may include a ferromagnetic layer (i.e., perpendicular-magnetized ferromagnetic (pFM)), and the magnetic logic device 100 may be configured to skew the magnetisation state by forming each of the two magnetic elements 102, 103 with an antiferromagnetic (AFM) layer or an in-plane ferromagnetic (iFM) layer for exchange coupling with the ferromagnetic layer. The AFM layer or the iFM layer may contact the ferromagnetic layer. Therefore, an interface may be defined between the ferromagnetic layer and the AFM layer or iFM layer. The AFM layer or the iFM layer may be part of the magnetic element 102, 103.

For each of the two magnetic elements 102, 103, the magnetic element 102, 103 may further include a non-magnetic (NM) material (or layer) between the ferromagnetic layer and the AFM layer or iFM layer.

In various embodiments, the magnetic logic device 100 may be configured to skew the magnetisation state by, for each of the two magnetic elements 102, 103, arranging an electrode and a dielectric layer between the electrode and the magnetic element 102, 103, and, wherein the magnetic logic device 100 may be configured so that, in response to a voltage applied to the electrode, an electric field is generated in the dielectric for tuning a magnetic anisotropy of the magnetic element 102, 103.

The magnetic logic device 100 may further include a rectification circuit electrically coupled to the conductive element 104 to rectify the Hall voltage. The rectification circuit may include a half-rectification circuit and/or a full rectification circuit. A defined threshold level may be employed for rectification of the Hall voltage.

In various embodiments, the magnetic logic device 100 may provide the outputs corresponding to at least one of AND, NOR, XNOR, XOR, NIMP, and converse NIMP logical operations. This means that, depending on the magnetisation state of each of the two magnetic elements 102, 103 and the respective read current applied to each of the two magnetic elements 102, 103, the magnetic logic device 100 may perform or carry out one or more of AND, NOR, XNOR, XOR, NIMP, and converse NIMP logical operations.

Figure 1B:
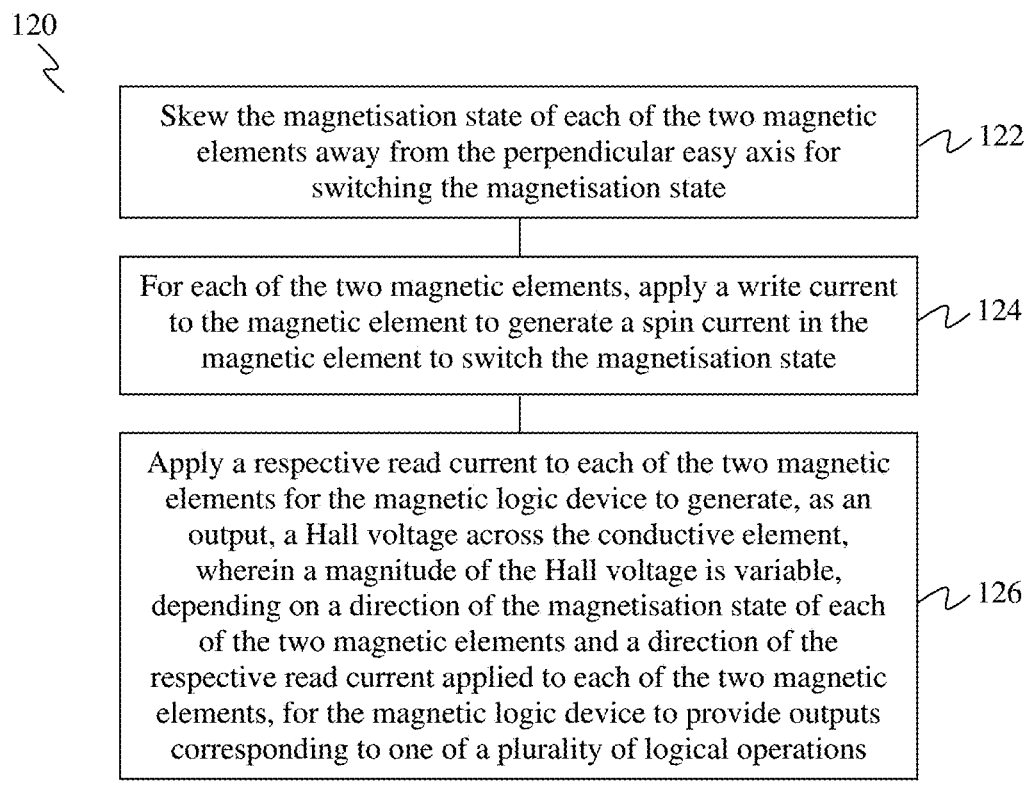
FIG. 1B shows a flow chart illustrating a method for controlling a magnetic logic device, according to various embodiments.

FIG. 1B shows a flow chart 120 illustrating a method for controlling a magnetic logic device, according to various embodiments. The magnetic logic device may be as described herein (e.g., in the context of the magnetic logic device 100), and having two magnetic elements and a conductive element coupled to the two magnetic elements and arranged at least substantially perpendicular to the two magnetic elements, wherein the magnetic logic device is configured, for each of the two magnetic elements, to have a magnetisation state with a perpendicular easy axis.

At 122, the magnetisation state of each of the two magnetic elements is skewed away from the perpendicular easy axis for switching the magnetisation state.

At 124, for each of the two magnetic elements, a write current is applied to the magnetic element to generate a spin current in the magnetic element to switch the magnetisation state.

At 126, respective read current is applied to each of the two magnetic elements for the magnetic logic device to generate, as an output, a Hall voltage across the conductive element, wherein a magnitude of the Hall voltage is variable, depending on a direction of the magnetisation state of each of the two magnetic elements and a direction of the respective read current applied to each of the two magnetic elements, for the magnetic logic device to provide outputs corresponding to one of a plurality of logical operations.

In one mode of operation, for each of the two magnetic elements, the direction of the respective read current may be fixed, and a direction of the write current applied to the magnetic element may be changed to change a polarity of the spin current to switch the magnetisation state, wherein the magnitude of the Hall voltage is variable in response to the change in the direction of the write current.

In a further mode of operation, for each of the two magnetic elements, the magnetisation state may be maintained (e.g., after the write operation or applying the write current once at 124), and the direction of the respective read current may be changed, wherein the magnitude of the Hall voltage is variable in response to the change in the direction of the respective read current.

At 122, a magnetic field may be generated, using an electromagnet, across the two magnetic elements to skew the magnetisation state of each of the two magnetic elements away from the perpendicular easy axis.

At 122, a field current may be applied to a conductive field bias line adjacent to the two magnetic elements to generate an Oersted field to interact with the two magnetic elements to skew the magnetisation state of each of the two magnetic elements away from the perpendicular easy axis.

A direction of the field current may be changed to change a direction of the Oersted field.

At 122, for each of the two magnetic elements, a voltage may be applied to an electrode arranged adjacent to the magnetic element to generate an electric field in a dielectric arranged between the electrode and the magnetic element for tuning a magnetic anisotropy of the magnetic element to skew the magnetisation state of each of the two magnetic elements away from the perpendicular easy axis.

In various embodiments, the Hall voltage may be rectified, or may undergo a rectification process.

In various embodiments, the magnetic logic device may be operated to provide the outputs corresponding to at least one of AND, NOR, XNOR, XOR, NIMP, and converse NIMP logical operations.

It should be appreciated that description in the context of the magnetic logic device 100 may correspondingly be applicable in relation to the method for controlling a magnetic logic device described in the context of the flow chart 120.

Figure 1C:
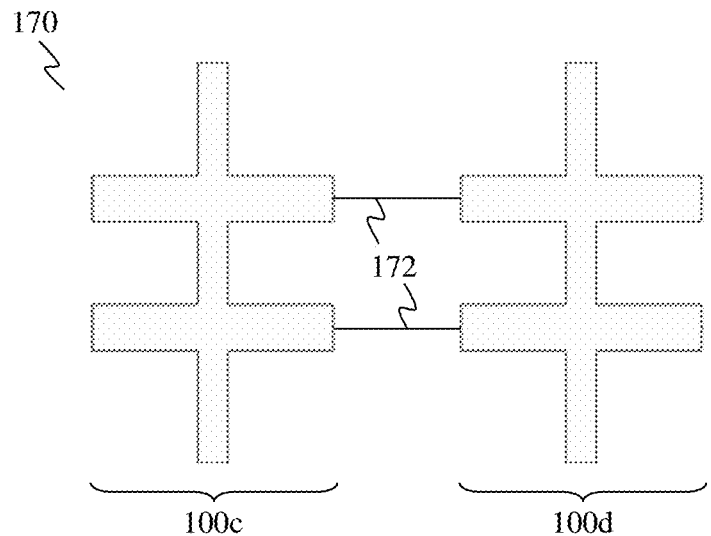
FIG. 1C shows a schematic top view of a circuit, according to various embodiments.

FIG. 1C shows a schematic top view of a circuit 170, according to various embodiments. The circuit 170 includes a first magnetic logic device 100c and a second magnetic logic device 100d electrically coupled to each other (as represented by lines 172), wherein the first magnetic logic device 170 may be as described herein (e.g., in the context of the magnetic logic device 100) to provide the outputs corresponding to an XOR logical operation, and wherein the second magnetic logic device 100d may be as described herein (e.g., in the context of the magnetic logic device 100) to provide the outputs corresponding to an AND logical operation. The circuit 170 may be configured as part of or as a half-adder circuit.

Figure 1D:
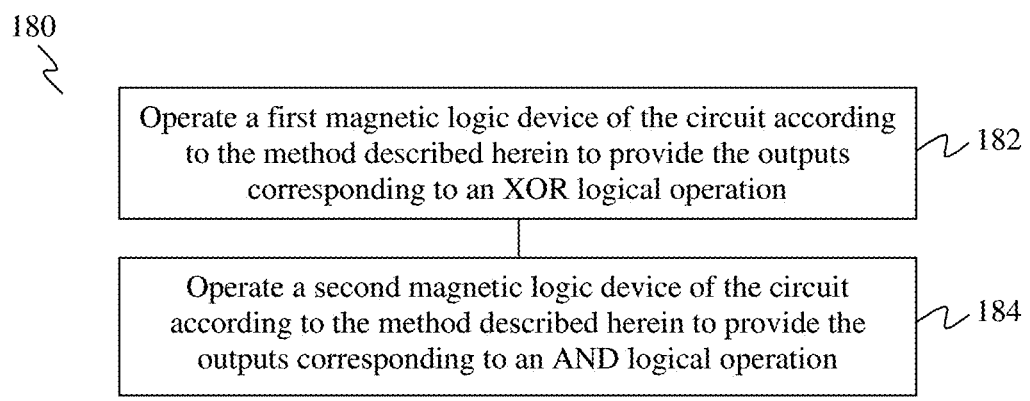
FIG. 1D shows a flow chart illustrating a method for controlling a circuit, according to various embodiments.

FIG. 1D shows a flow chart 180 illustrating a method for controlling a circuit, according to various embodiments.

At 182, a first magnetic logic device of the circuit is operated according to the method described herein to provide the outputs corresponding to an XOR logical operation.

At 184, a second magnetic logic device of the circuit is operated according to the method described herein to provide the outputs corresponding to an AND logical operation.

The circuit may be as described herein (e.g., in the context of the circuit 170), where the first magnetic logic device and the second magnetic logic device are electrically coupled to each other.

While the methods described above are illustrated and described as a series of steps or events, it will be appreciated that any ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments described herein. Also, one or more of the steps depicted herein may be carried out in one or more separate acts and/or phases.

Various embodiments may relate to a magnetic logic device. The magnetic logic device may include two Hall crossbar structures connected in series such that a parallel pair of channels (e.g., in the form of nanowires) may be connected by a single Hall bar which may be arranged perpendicular to the channels, wherein each channel may be configured to receive a corresponding write current, and wherein the magnetic logic device may be configured to perform one of a plurality of logic operations dependent on the polarity of the write current in each channel, the magnetic field direction applied to the magnetic logic device, and a direction of a probing current inputted to each channel. An output of the magnetic logic device may be the voltage measured across the Hall bar. Half rectification or full rectification may be carried out on the measured voltage. The logic operation performed by the magnetic logic device may also be dependent on the half rectification or full rectification of the measured voltage. Half rectification or full rectification may be carried out using one or more circuits, which may be external circuit(s) or implemented on the same substrate as the logic device.

The Hall bar is arranged perpendicular to the channels as the anomalous Hall voltage, $V_H$, is orthogonal to both the current flow direction and magnetisation. If current flows in the (x) direction and the magnetisation is in the (z) direction, then $V_H$ forms across the (y) direction. In embodiments where a magnetic field is applied as described herein, as the magnetic field needs to be coaxial to the current direction, the pair of channels may be arranged parallel to each other, for example, in the case of an externally applied magnetic field by a magnet or electromagnet. In the case of the bias field line (as will be described further below), the channels may not or do not necessarily need to be parallel, since the bias field line may be redirected or reoriented such that the generated field is coaxial to the current flow through the channels.

Various embodiments will now be further described by way of the following non-limiting examples and with reference to the figures.

For the devices of various embodiments, besides storing data as a magnetic state in a magnetic nanowire, logic operations may also be performed on these binary bits stored in the data. It is achieved by connecting two nanowires with a single Hall bar (or equivalently, two Hall crosses in series sharing a common Hall bar). A "Hall bar" means a bar capable of exhibiting Hall effect. Each Hall cross has a cross-shaped structure having at least part of the Hall bar which may be arranged transverse to the corresponding nanowire and used for electrically measuring the anomalous Hall voltage $V_H$. Each Hall cross may be patterned out of a perpendicular-magnetized ferromagnetic (pFM) material interfaced with a heavy metal (HM). When a charge current (e.g., any flow of current (or electrons) through the device that, regardless of amplitude, results in spin current due to SOC) is applied through the nanowires, a transverse spin current generated within the HM due to spin-orbit coupling may accumulate at the HM-pFM interface. Subsequently, the spin current may be injected into the pFM across the interface, leading to the switching of the magnetic state. The polarity of spins injected at the interface depends on the polarity of the charge current, thus, opposite magnetisation states in the device may be achieved by injecting opposite polarities of charge currents. The switching of the magnetic state may be probed by anomalous Hall effect (AHE) in which a voltage drop across the Hall bar (the anomalous Hall voltage ($V_H$)) due to a probing current ($I_{probe}$) (or read current) depends on the orientation of the magnetisation across each nanowire. The AHE (different from the ordinary Hall effect (OHE)) describes $V_H$ due to local magnetisation. This may mean that, in AHE, $V_H$ forms due to the local magnetisation in the magnetic material and no external field is required during the measurement process.

In the devices disclosed herein, the anomalous Hall resistance ($R_H$) may be determined by $R_H = V_H/I_{probe}$. The $V_H$ and corresponding $R_H$ across the Hall bar is the sum of contributions from the two individual Hall cross structures as they are connected in series, given by $V_H = V_{H,1} + V_{H,2}$ ($V_{H,1}$ and $V_{H,2}$ being respective voltages associated with the two individual Hall cross structures). The main path in which the current flows through has to be magnetic, and, therefore, the (horizontal) nanowires are magnetic. The (vertical) Hall bar in which $V_H$ is sensed, may be magnetic although it may instead be non-magnetic, and may be made of a non-magnetic conductive material.

The anomalous Hall voltage, $V_H$, is an indication of how much "up-ness" and "down-ness" of magnetisation is in the perpendicularly magnetized device. A fully "up"/"down" magnetisation yields $+V_H/-V_H$.

In various embodiments, for devices with perpendicular magnetic anisotropy (PMA), spin current and a technique to cant/skew the magnetisation (e.g., using magnetic field) may be required for magnetisation switching. A magnetic field may be required to ensure deterministic switching. The magnetic field may be an external one (such as use of a large magnet, or an electromagnet) or may be provided via a bias field line instead so that this field generation is local to the device. Using the bias field line, the local magnetic field may be turned on and off and the polarity of the local magnetic field may be toggled.

In various embodiments, the nanowires and the Hall bar (therefore, the Hall crosses) may have the same materials and/or heterostructure and/or multilayer structure. Each nanowire is of a magnetic material. Each nanowire and the Hall bar may be magnetic. The nanowires and the Hall bar may have the same magnetic material. Nevertheless, optionally, the Hall bar may be of a non-magnetic material or a completely non-magnetic conductive material. Each nanowire and the Hall bar are electrically conductive.

The nanowires and the Hall bar may be connected or coupled to each other. The nanowires and the Hall bar (therefore, the Hall crosses) may be formed as a single integrated structure. Nevertheless, it should be appreciated that each of the nanowires and the Hall bar may be formed separately, with the Hall bar being coupled or connected to the nanowires.

Figure 2A:
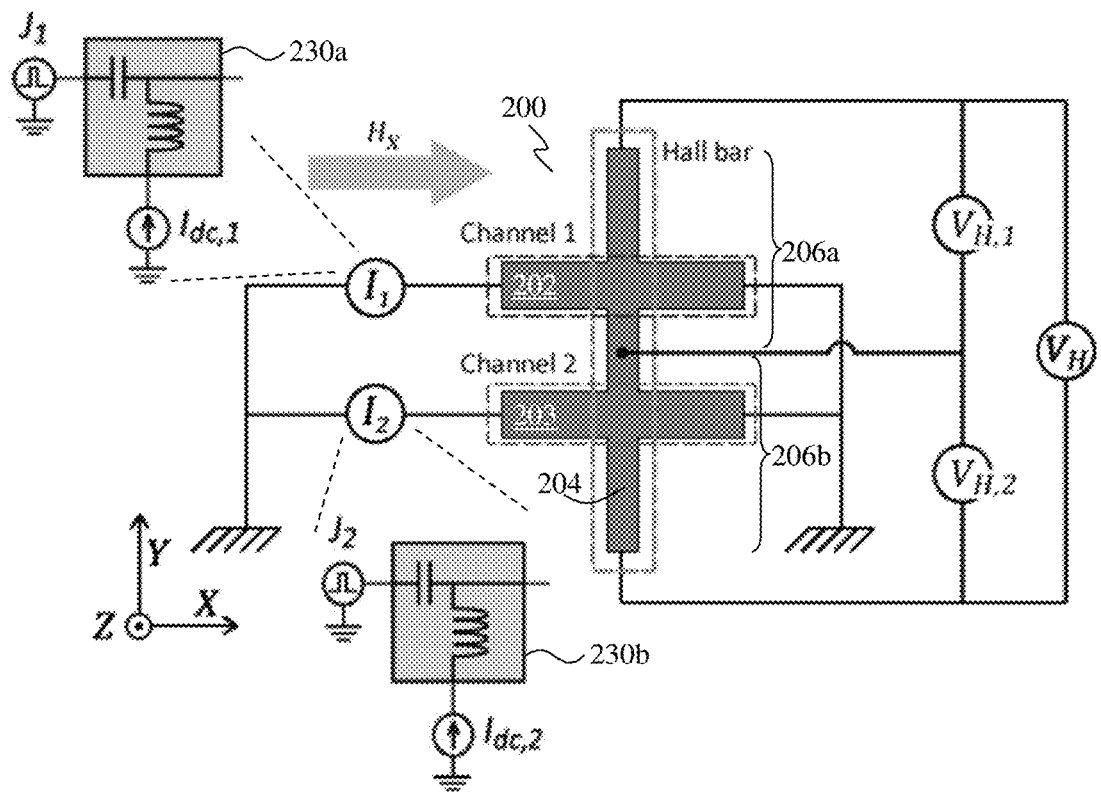
FIG. 2A shows a schematic diagram of a spin-orbit torque driven logic device, according to various embodiments.

FIG. 2A shows a schematic diagram of a spin-orbit torque driven logic device 200, according to various embodiments, illustrating the device structure. Also shown is the measurement set-up for the device 200. The device 200 includes two magnetive elements (e.g., nanowires) 202, 203 sharing a common conductive bar (Hall bar) 204. The two magnetive elements (or magnetic structures or bars) 202, 203 and the common conductive bar 204 are coupled to each other. The first magnetive element 202 (shown within the top horizontal dashed rectangle) may define "Channel 1", while the second magnetive element 203 (shown within the bottom horizontal dashed rectangle) may define "Channel 2". The Hall bar 204 is shown within the vertical dashed rectangle. The magnetive elements 202, 203 may be arranged at least substantially parallel to each other. The Hall bar 204 is arranged at least substantially perpendicular to the magnetive elements 202, 203. As shown in FIG. 2A, the magnetive elements 202, 203 are arranged in a horizontal direction (along the X-direction) while the Hall bar 204 is arranged in a vertical direction (along the Y-direction).

The magnetive elements (or nanowires) 202, 203 and the Hall bar 204 may define two separate Hall crosses 206a, 206b connected in series along their individual Hall bars (as part of the Hall bar 204). As a non-limiting example, the structure may be formed by forming the two Hall crosses 206a, 206b integrally.

Figure 2B:
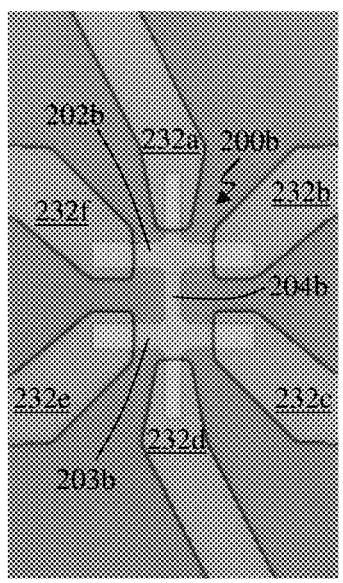
FIG. 2B shows an optical micrograph of a fabricated device with contact electrodes, according to various embodiments.

FIG. 2B shows an optical micrograph of a fabricated device 200b with contact electrodes (or electrical contacts) 232a, 232b, 232c, 232d, 232e, 232f electrically coupled thereto. Similar to the device 200 (FIG. 2A), the device 200b includes two magnetive elements (or nanowires) 202b, 203b and a common Hall bar 204b (electrically) coupled to one another. As may be observed, two crosses in series may be defined. The two crosses define six arms, each arm being (electrically) coupled to or in contact with a respective electrode 232a, 232b, 232c, 232d, 232e, 232f. Electrodes 232a, 232d may be employed for $V_H$ measurements across the Hall bar 204b, while electrodes 232b, 232f may be employed for current injection for magnetive element 202b (Channel 1) and electrodes 232c, 232e may be employed for current injection for magnetive element 203b (Channel 2).

Referring to the measurement or operation set-up for the device 200 as shown in FIG. 2A, currents may be delivered through the two inputs $I_1$ and $I_2$ respectively to the magnetive elements 202, 203. Bidirectional writing and reading (or probing) currents may be delivered through the inputs $I_1$ and $I_2$. A current of positive polarity may be defined as logic "1" or true (T), while a negative polarity may be defined as logic "0" or false (F). The polarity of the current through each input may be controlled independently of each other. The resultant of the logic functionality may be read by delivering a read or probing current, $I_{dc,1}$ (or $I_{probe,1}$) and $I_{dc,2}$ (or $I_{probe,2}$), respectively to the magnetic elements 202, 203, and measuring the voltage drop across the Hall bar 204 due to the cumulative $V_H$ across both junctions or crosses 206a, 206b. Due to the anomalous Hall effect (AHE), the state of the device 200 may be measured from the voltage drop (Hall voltage, $V_H$) across the Hall bar 204. As shown in FIG. 2A, a bias tee (which is a three-port device) 230a, 230b may be respectively provided for each of the input current sources $I_1$ and $I_2$, for supplying currents through the respective channels, i.e., Channel 1 and Channel 2. Each bias tee 230a, 230b may enable a respective write current (e.g., a write pulse) or write current density $J_1$, $J_2$, and a respective read or probe current $I_{dc,1}$ (or $I_{probe,1}$), $I_{dc,2}$ (or $I_{probe,2}$) to be supplied to or through the respective channel.

The junctions of the nanowires 202, 203 and the common Hall bar 204 may be symmetric, and, effectively the two Hall crosses 206a, 206b may be symmetric. In such a configuration, the voltage, $V_{H,1}$, across or associated with the first cross 206a and the voltage, $V_{H,2}$, across or associated with the second cross 206b may be at least substantially similar, i.e., $V_{H,1} \approx V_{H,2}$. $V_{H,n}$ may either be a positive or a negative value for up or down magnetisation states, respectively, where the subscript n refers to the channel number. The magnetisation states may be arbitrarily assigned, e.g., the up magnetisation state as "1" and the down magnetisation state "0". Consequently, the possible measured voltage drops due to the cumulative $V_H$ may be $(+V_{H,1}+V_{H,2})$, $(-V_{H,1}-V_{H,2})$, or zero for the possible combinations of $(+V_{H,1}-V_{H,2})$ and $(-V_{H,1}+V_{H,2})$. Therefore, the output may be also interpreted in a similar convention as the input—a finite voltage drop may be normalised to ±1, whereas a zero-voltage drop may be considered as "0".

As a non-limiting example, perpendicularly magnetized thin films of Ta/Pt/[Co/Pt]$_3$/Co/Ta may be employed. For example, a film stack of Ta (5)/Pt (3)/[Co (0.6)/Pt (0.6)]$_3$/Co (0.6)/Ta (5) (thickness in nanometer) may be deposited on thermally-oxidised Si substrates by dc magnetron sputtering at a base pressure better than $5 \times 10^{-8}$ Torr at room temperature. Numbers in parentheses indicate nominal film thicknesses in nanometers and the subscript indicates the number of [Co/Pt] bilayer repeats. The thin film stack is perpendicularly magnetized as-deposited. The blanket films may be patterned using electron beam lithography and Ar (argon) ion milling techniques to define a device structure (e.g., 200, FIG. 200b, FIG. 2B) resembling two identical Hall crosses (e.g., 206a, 206b, FIG. 2A) sharing one common Hall bar (e.g., 204, FIG. 2A; 204b, FIG. 2B). The double Hall cross structure may be referred to as a "logic device". The wire widths (e.g., 202, 203, FIG. 2A; 202b, 203b, FIG. 2B) may be about 5 µm, and electrical contacts (e.g., 232a, 232b, 232c, 232d, 232e, 232f, FIG. 2B) having Ti (5)/Cu (100)/Ta (5) may be patterned and deposited at the wire ends.

After fabrication, the devices may be measured using 4-terminal Hall voltage measurement using a source measure unit (e.g., Keithley 2400). An external magnetic field may be provided by an electromagnet (e.g., LakeShore EM4 electromagnet). For logic operation, a bias tee (e.g., 230a, 230b, FIG. 2A) may be used to couple the probing dc input from a source measure unit (e.g., Keithley 2400) with the RF input from a pulse generator (e.g., Picosecond Pulse Labs 10,300B). Each bias tee may enable write $J_n=1.5 \times 10^7$ A cm$^{-2}$ and read $I_{dc,n}=100$ µA currents to be delivered through each Channel n (see FIG. 2A, where n=1, 2), and the cumulative anomalous Hall voltage $V_H=V_{H,1}+V_{H,2}$ may be probed along the Hall bar. Since $V_H \propto I_{dc} m_z$, $V_H$ provides an indication of the magnetisation of the device. The parameter $m_z$ is the magnetisation in the z-direction, i.e., out of plane direction. The magnetisation in this thin film and device is such that it points in the +z or −z direction, and the z-axis is the axis of anisotropy. Therefore, the anomalous Hall voltage $V_H$ is proportional to the probing dc current amplitude and the degree of out-of-plane magnetisation.

Figure 2C:
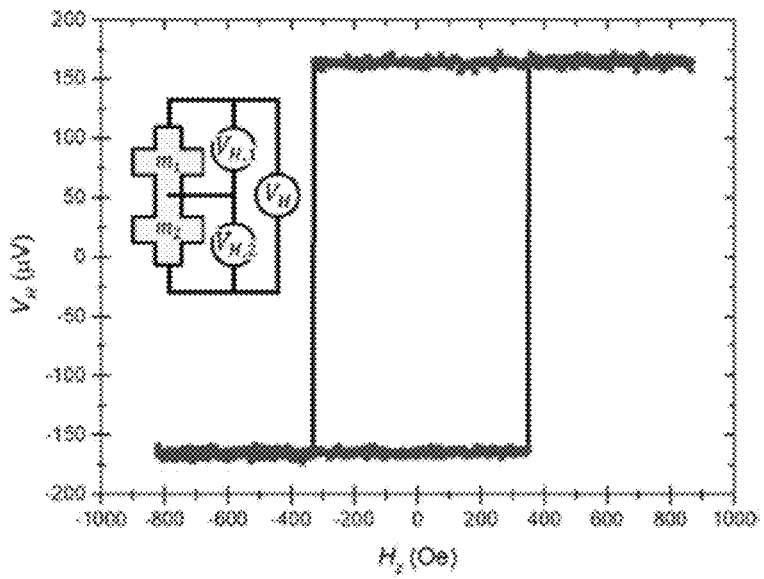
FIG. 2C shows a plot of cumulative anomalous Hall voltage $V_H$ in a sweeping out-of-plane magnetic field $H_z$.

To ensure that the perpendicular magnetic anisotropy (PMA) may be preserved in the patterned logic device, $V_H$ may be probed in a scanning OOP (out-of-plane) field H as shown in FIG. 2C. The resulting hysteresis loop shows sharp transitions at about $|H_c|=350$ Oe, from which may be inferred that the magnetisation at the channel junctions switch at about the same $H_c$, meaning that the magnetisation at each channel has about the same switching field $H_c$. As the junctions (or Hall crosses) are of similar geometry and multilayer structure, it is expected that $|V_{H,1}| \approx |V_{H,2}|$.

For magnetisation switching to take place in spin-transfer torque (STT) driven devices such as STT-MRAM, a fixed layer provides the necessary spin polarization of an otherwise unpolarised charge current. The spin polarised current then passes through a free layer where momentum exchange results in magnetisation rotation and switching. A "fixed layer" is a layer with harder magnetisation, i.e., layer with larger anisotropy, which is harder to switch. Due to this property, randomly polarised electrons tend to be polarised by this magnetic layer. A "free layer" is a layer with lower anisotropy, easier to switch, and utilised as the layer in which data is stored. Polarized electrons can transfer momentum to the softer local magnetisation and cause the magnetisation to switch.

On the contrary, a fixed layer is unnecessary for SOT-driven magnetisation switching. An unpolarised charge current flowing through a HM (heavy metal) layer with large SOC (spin-orbit coupling) may result in spin accumulation at the interfaces, which may diffuse into an adjacent ferromagnetic layer and apply a torque to the magnetisation, leading to magnetisation switching. For SOT to induce deterministic switching in devices with PMA, the magnetisation may be canted toward the ±x-direction orthogonal to both the anisotropy axis ($\hat{z}$) and spin polarization ($\hat{y}$). This may be achieved with an externally applied field $H_x$, or via exchange coupling with an adjacent magnetic layer. The former allows for improved anomalous Hall signal-to-noise ratio as the magnetisation canting may be toggled on and off, as well as reconfigurability by switching the magnetic field direction to achieve polymorphic logic device functionality. On the other hand, the latter affords an integrated solution for magnetisation canting. As such, a means of localising the required magnetic field using an integrated bias field line may afford us the features mentioned. In various embodiments, SOT-driven switching may be achieved using 100 ns write pulses of current density $J_1, J_2=\pm 1.5 \times 10^7$ A cm$^{-2}$ in the presence of $H_x$. After each write process, the magnetisation state of the device may be determined by measuring $V_H$ with a probing current $I_{dc,n}=\pm 100$ µA concurrently through each channel n. The current-induced SOT switching according to the techniques disclosed herein may enable deterministic magnetisation switching for individual Hall crosses.

Figure 3A:
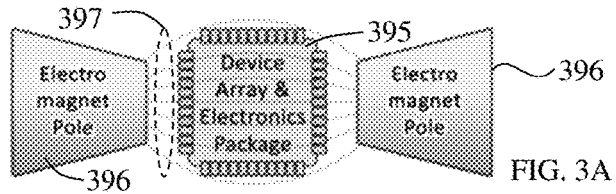
FIG. 3A shows a schematic illustration of a chip package having a device array with integrated electronics between electromagnet poles.

As described, in SOT-driven current-induced magnetisation switching (CIMS), such as the techniques disclosed herein, an in-plane field ($H_x$) coaxial to the writing current may be provided to cant or skew the device magnetisation from the perpendicular easy-axis and break the switching symmetry for achieving deterministic switching. The direction of $H_x$ may be parallel or anti-parallel to the write and read currents. $H_x$ may be provided by an external electromagnet 396, as illustrated in FIG. 3A. In such an arrangement, if the device is part of an array or integrated as part of a larger system (e.g., a chip package 395 having a device array with integrated electronics), the electromagnet poles 396 subject the entire circuit or array of devices, or part/ whole of the system to a 'global' magnetic field (represented by magnetic field lines 397). However, there are challenges as this may lead to undesired operational behaviour. Further, this may require a large magnet or electromagnet to generate a field large enough to be uniform across all devices. Therefore, methods of localising the magnetic field or to completely do away with a magnetic field to achieve deterministic field-free switching may be provided.

In various embodiments, a local (magnetic) field may be generated by passing a current through a field line that runs adjacent to the intended devices, such that the current through the field line generates a local Oersted field that envelops only the intended devices. Beginning with spin-orbit torque for perpendicularly magnetized devices: a field may be needed to ensure that the switching is deterministic, for the operation of the device. Without the field, there are challenges that the device may not switch reliably.

Figure 3B:
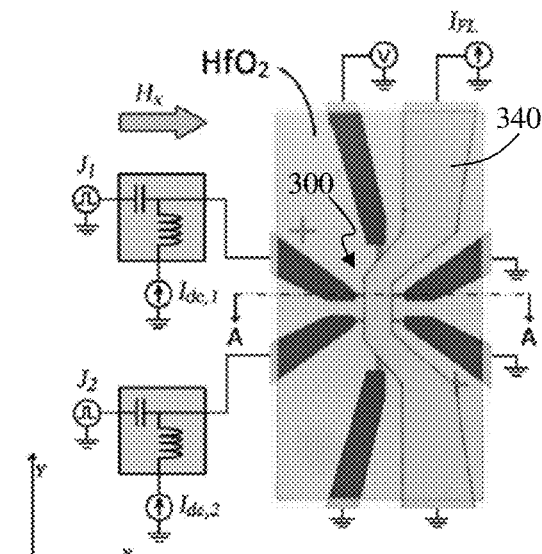
Figure 3C:
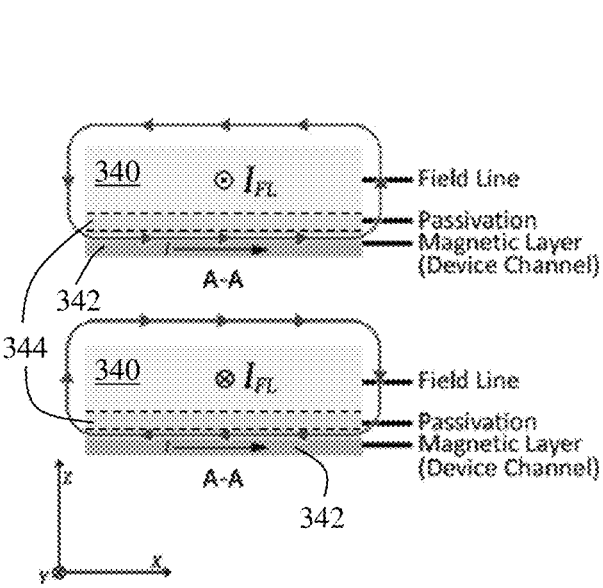
FIG. 3C shows a schematic diagram of a cross-sectional view of the device along line A-A.

FIG. 3B shows an optical microscopy image of a spin-orbit torque driven logic device 300 with an integrated bias field line 340. This may allow the device to be self-contained and compact. While not clearly shown in FIG. 3B, the device 300 may have a similar structure as the device 200 (FIG. 2A), 200b (FIG. 2B). The measurement or operation set-up for the device 300 are also shown. There are respective bias tees for supplying input currents, similar to FIG. 2A, and electrical contacts electrically coupled to the device 300, similar to FIG. 2B. FIG. 3C shows a schematic diagram of a cross-sectional view of the device along line A-A along the length of the top channel, illustrating the generation of a local Oersted field (represented by the closed loop paths with arrows) due to current flows along the bias field line 340. The field line 340 may be electrically isolated from the device 300 (or magnetic layer 342) by a passivation layer 344 (e.g., containing hafnium oxide, $HfO_2$). The magnetic layer 342 may be or may contain a perpendicular ferromagnetic layer (pFM). The magnetic layer 342 may further include at least one heavy metal (HM) layer. The magnetic layer 342 may include a multilayer stack having pFM with the bottom-most or top-most layer of the stack being the HM layer, or having two HM layers sandwiching the pFM on the top and bottom.

Currents, $I_{FL}$, of opposite polarities may be supplied through the field line 340, generating local Oersted fields of corresponding opposite polarities. For the top image of FIG. 3C, the current through the field line, $I_{FL}$, is in a direction out of the page, while, for the bottom image of FIG. 3C, the current through the field line, $I_{FL}$, is in a direction into the page. The local field experienced by the device 300 may be parallel or antiparallel to the current flow, I, through the device 300 (see current, I, indicated through the magnetic layer 342 in FIG. 3C, representing the write and/or read currents). By providing the bias field line 340, the bias field (Oersted field) may be turned on and turned off, and the polarity of the field may be changed. Turning off the bias field lets the magnetisation fully point in the "up" or "down" state, allowing maximum anomalous Hall voltage read-out.

The field line 340 may be fabricated by depositing one or more conductive metals, including but not limited to, copper (Cu), gold (Au), silver (Ag) or aluminium (Al). The field line 340 may be patterned such that the Oersted field generated may be coaxial to the write and read current directions, as shown in FIG. 3C. The Oersted field generated by the field line 340 may be local, and only the intended devices 300 may be subjected to it. A passivation layer 344 electrically isolates the field line 340 from the device 300. The proximity of the field line 340 to the device 300 may be tuned by varying the thickness of the passivation layer 344, such that the Oersted field generated for a given field line current, $I_{FL}$, may be sufficient to provide deterministic switching of the intended device 300, while leaving neighbouring devices unperturbed.

In further embodiments, the multilayer stack of the device may be modified to cant or skew the device magnetisation through exchange coupling with, for example, an antiferromagnetic (AFM) layer or an in-plane ferromagnetic (iFM) layer. Such arrangements may allow for field-free magnetisation switching. In other words, such embodiments may not require a field (e.g., Oersted field) for operation. However, there are challenges in that the exchange bias is added complexity to the multilayer stack that may be tuned, and that the exchange bias cannot be "turned off", meaning that the magnetisation is always canted. Since $V_H$ is proportional to the amount of out-of-plane magnetisation, this may reduce the $V_H$ amplitude, since the exchange bias is always present and the magnetisation is always skewed. Further, the direction of the exchange bias cannot be changed. Changing the direction will also change the current-induced magnetisation switching direction.

Figure 3D:
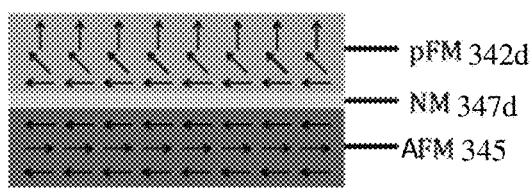

FIG. 3D shows a schematic diagram for exchange bias of the perpendicularly-magnetized ferromagnetic (pFM) layer with an antiferromagnetic (AFM) layer. An optional spacer layer 347d is also shown. The canting or skewing of the device magnetisation may be achieved through exchange coupling achieved by interfacing an AFM layer 345 with the pFM layer 342d. The AFM layer 345 may include but not limited to one or more of IrMn (iridium manganese), PtMn (platinum manganese), FeMn (iron manganese), PdMn (palladium manganese), NiMn (nickel manganese) or NiO (nickel oxide). An optional spacer layer 347d having a non-magnetic (NM) material (e.g., copper (Cu) or ruthernium (Ru) or tantalum (Ta)) may be sandwiched between the AFM layer 345 and the pFM layer 342d to tune the exchange coupling strength between the AFM layer 345 and the pFM layer 342d.

Figure 3E:
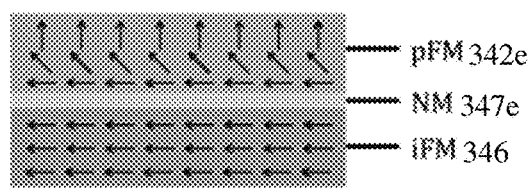
FIG. 3E shows a schematic diagram for exchange coupling of the perpendicularly-magnetized ferromagnetic (pFM) layer with an in-plane ferromagnetic (iFM) layer.

FIG. 3E shows a schematic diagram for exchange coupling of the perpendicularly-magnetized ferromagnetic (pFM) layer with an in-plane ferromagnetic (iFM) layer. An optional spacer layer 347e is also shown. The canting or skewing of the device magnetisation may be achieved through exchange coupling achieved by the addition of an iFM layer (e.g., NiFe (nickel iron), Co (cobalt), CoFeB (cobalt-iron-boron)) 346 sharing a common interface with the pFM layer 342e. An optional spacer layer 347e having a non-magnetic (NM) material (e.g., copper (Cu) or ruthernium (Ru) or tantalum (Ta)) may be sandwiched between the iFM layer 346 and the pFM layer 342e to tune the exchange coupling strength between the iFM layer 346 and the pFM layer 342e.

The non-magnetic (NM) layers 347d, 347e are optional. As a non-limiting example, ruthenium (Ru) may be used as a non-magnetic layer due to the RKKY (Ruderman-Kittel-Kasuya-Yosida) coupling mechanism that allows ferro- and anti-ferromagnetic coupling based on how thick the Ru layer is.

Exchange coupling works when neighbouring spins influence each other. Using FIG. 3E as a non-limiting example, the pFM 342e is out-of-plane, while the iFM 346 is in-plane. The proximity of the spins (represented by the arrows therein) of the iFM 346 cause some of the spins (represented by the arrows therein) of the pFM 342e to skew, as illustrated in FIG. 3E.

Figure 3F:
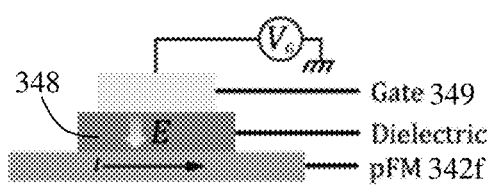
Figure 3G:
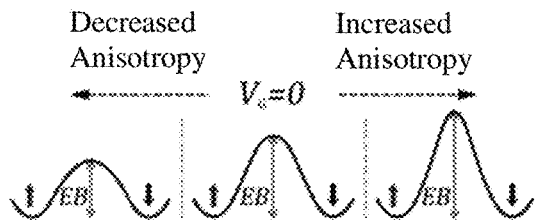
FIG. 3G shows a schematic illustration of the effect of voltage, $V_G$, on the magnetic anisotropy of the pFM layer.

In further embodiments, the magnetic properties of a pFM layer 342f may be tuned through voltage-controlled magnetic anisotropy (VCMA), as shown in FIG. 3F. In this technique, a layer of dielectric 348 may be sandwiched between the pFM layer 342f and a gate electrode 349. The dielectric layer 348 may include but not limited to one or more of hafnium oxide ($HfO_2$), manganese oxide (MgO), gadolinium oxide ($Gd_2O_3$), aluminium oxide ($Al_2O_3$), titanium oxide ($TiO_2$), or one or more ionic liquids. The gate electrode 349 may include but not limited to one or more of Cu, Au, Ag or Al. The gate electrode 349 and the device (having the pFM layer 342f) are electrically isolated by the dielectric 348. An electric field may be built up in the dielectric 348 when a non-zero voltage, $V_G$, is applied such that the energy barrier EB may be tuned and, consequently, the magnetic anisotropy of the pFM 342f may be increased or decreased, as shown in FIG. 3G. A larger anisotropy makes it harder to switch between the up and down spin states, while a smaller anisotropy makes it easier to switch between the up and down spin states.

Figure 4A:
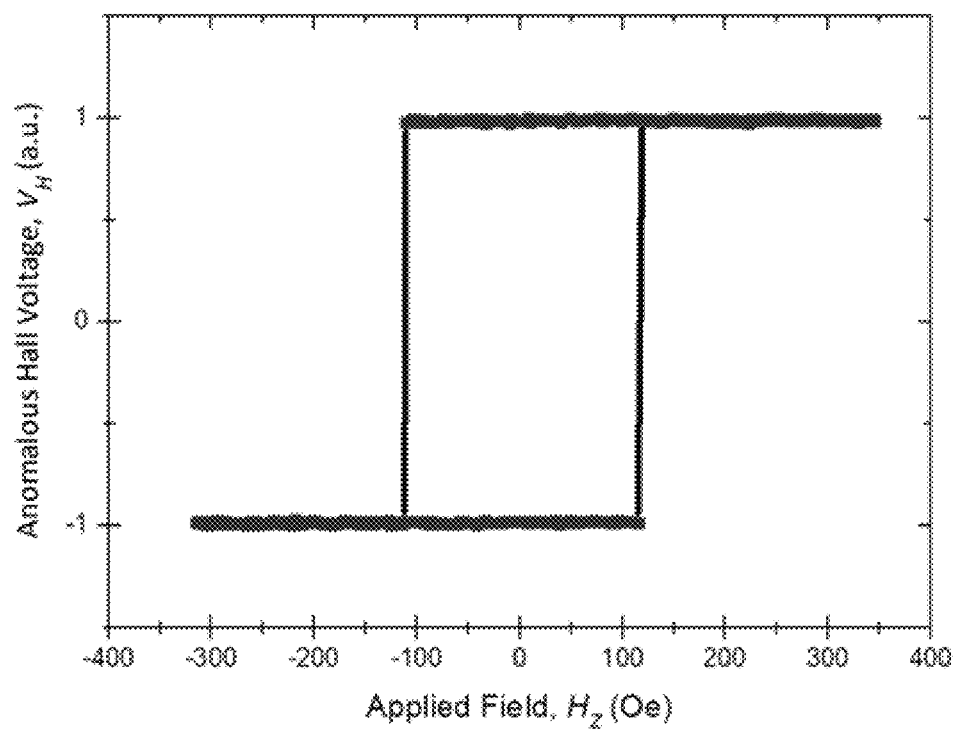
FIG. 4A shows a plot of measurement of $V_H$ of the device in a scanning magnetic field in the Z-direction.

In various embodiment, a non-limiting example of the pFM multilayer film stack may be composed of Pt(3)/Co (0.3)/[Pt(0.6)/Co(0.3)]$_3$/Ta(3) (numbers in brackets indicate thicknesses in nm) that may be sputter-deposited on Ta(3) seed on thermally grown $SiO_2$ substrate, although such recipe is not so limited. In further embodiments, the pFM layer may include cobalt-iron (CoFe) or cobalt-iron-boron (CoFeB) sandwiched by a magnesium oxide (MgO) layer and a heavy metal (HM) layer. In further embodiments, the pFM layer may include Pt/[Co/Ni]$_n$ or Pt/[Co/Pt]$_n$ where the subscript n is the number of multilayer repeats. The multilayer stack of Ta/Pt/[Co/Pt]$_3$/Co/Ta, as described above, is confirmed to be perpendicularly magnetized as shown by the hysteresis loop measured while sweeping an out of plane magnetic field as shown in FIG. 4A, where the square hysteresis loop shows good perpendicular magnetic anisotropy. Generally for spin-orbit torque (SOT) operation, a HM (e.g., Ta, Pt, W, etc.) may be required at least on one side of the stack. While HM may be used on both sides of the stack, the materials are to be different (e.g., Pt/FM/Ta). Further, a HM may be used on one side of the stack and a dielectric (which is neither magnetic nor conductive) on the other side, e.g., Pt/FM/MgO or Ta/FM/MgO.

Hall cross structures having a parallel pair of 5 μm wide channels (e.g., 202, 203, FIG. 2A) connected by a shared single Hall bar (e.g., 204, FIG. 2A) of about 2 μm width may be fabricated using electron beam lithography and Ar-ion milling techniques. The wire widths for both channels and the Hall bars may be reduced to the nanometer (nm) regime, and operated at the appropriate current densities, without or minimally affecting the general behaviour of the device. Ti(5)/Cu(100)/Ru(5) electrodes (e.g., 232a, 232b, 232c, 232d, 232e, 232f, FIG. 2B) may be deposited to provide contacts for current injection and $V_H$ measurements.

Figure 4B:
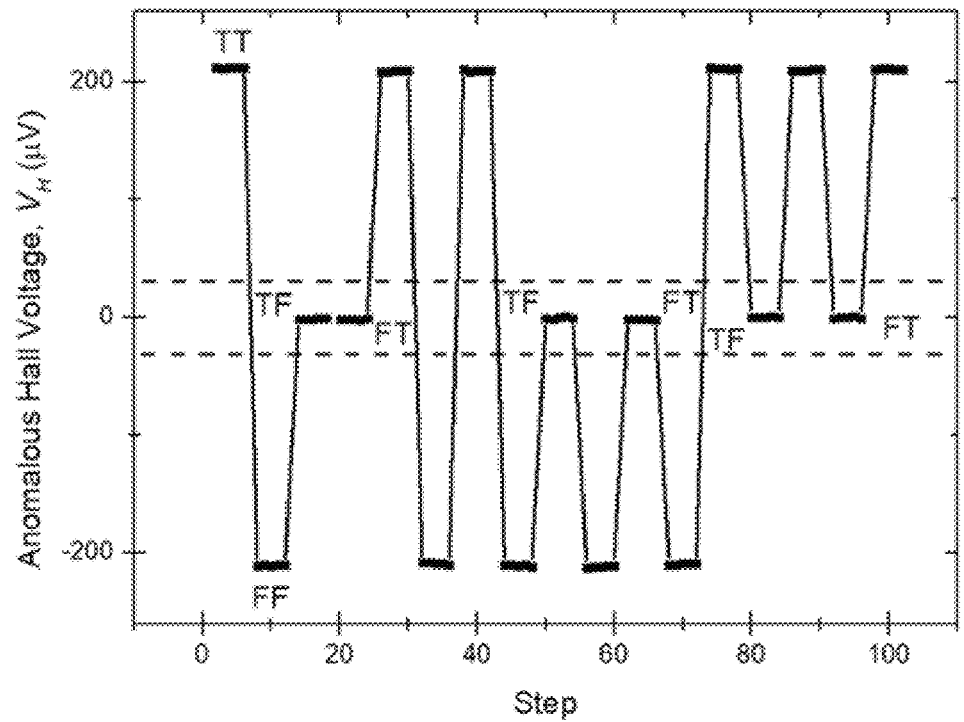
FIG. 4B shows a plot of measurement $V_H$ of the device with various combinations of the sign of the write currents in an external magnetic field of 300 Oe in the +X-direction.

For spin-orbit torque induced magnetisation switching, an external magnetic field (e.g., provided by some larger magnets or electromagnets, where such field provides the magnetisation canting/skewing) may be applied coaxial to the current direction for breaking the switching symmetry. Bipolar switching may be achieved by changing the polarity of the write current. When the field and current directions are parallel, the spin-orbit torque exerted by the accumulated spins injected at the interface may switch the magnetisation from the down state to the up state. When the field and current are anti-parallel, the magnetisation may be switched from the up state to the down state. Here, "up" and "down" are arbitrary orientations to describe the magnetisation states of the device. Shown in FIG. 4B is the cumulative $V_H$ of the device with various permutations of write pulse polarities applied through both nanowires (corresponding to Channels 1, 2), and with the application of an external magnetic field. In FIG. 4B, the notation "T" corresponds to a positive current polarity whereas the notation "F" corresponds to a negative current polarity. For each pair of letters (e.g., TT, TF, FF, etc.), the left-side letter corresponds to Channel 1 while the right-side letter corresponds to Channel 2. Nevertheless, due to the symmetrical configuration, the left-side letter may instead correspond to Channel 2 while the right-side letter may correspond to Channel 1. The $V_H$ of the device is measured for all four combinations of the directions of current pulses applied through the nanowires (i.e., Channels 1, 2).

Figure 6B:
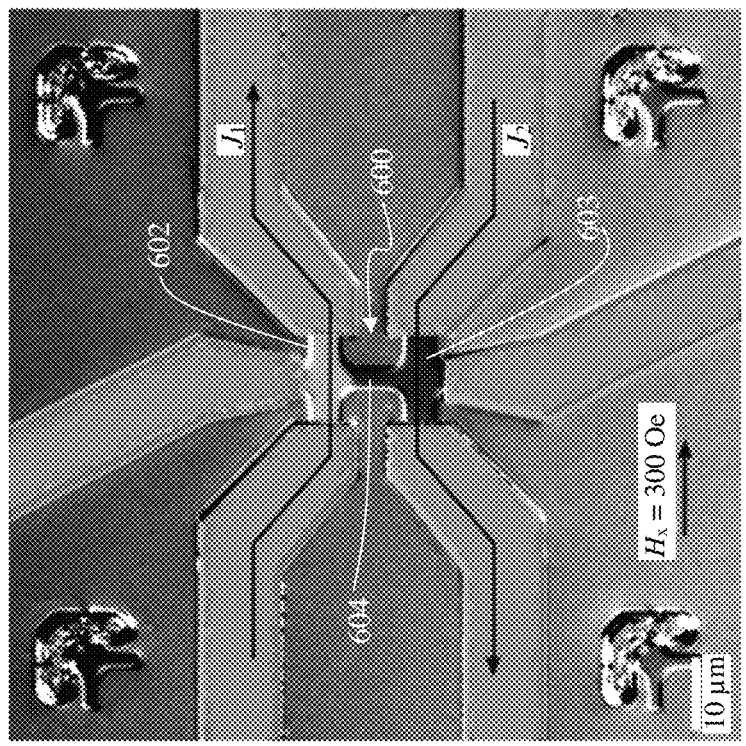
FIGS. 6A and 6B show Kerr microscopy images for the device of various embodiments for application of write pulses of different polarities.
Figure 6A:
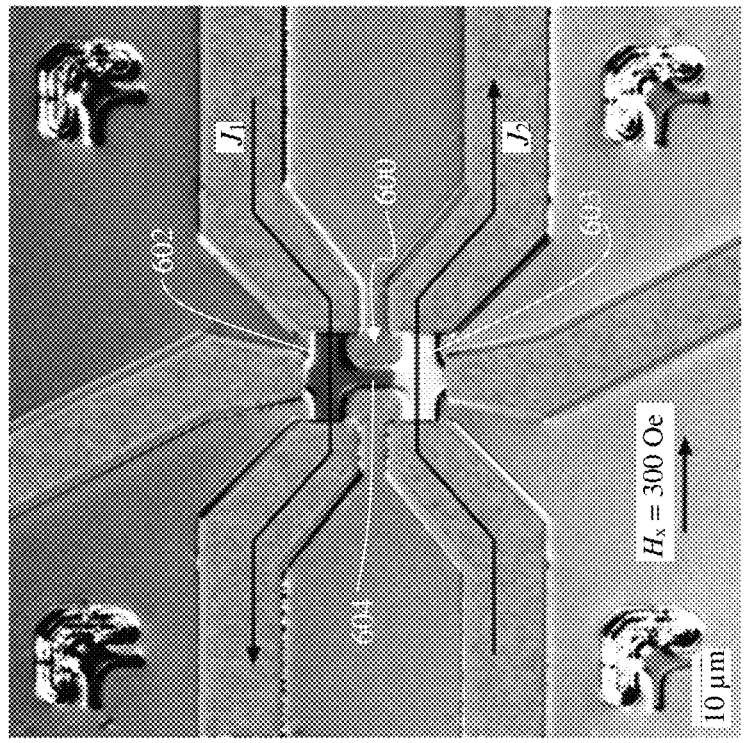

FIGS. 6A and 6B show Kerr microscopy images (obtained using, for example, the MagVision Kerr microscopy system) for the device 600 of various embodiments for application of write pulses of different polarities. The figures represent the magnetisation states across each nanowire or magnetic element 602, 603 for (TF) and (FT) inputs, respectively. The arrows indicate the direction of current flow of the input pulses $I_1$ (or $J_1$) and $I_2$ (or $J_2$). FIG. 6A shows the Kerr microscopy image of the device 600 when a positive pulse is applied through the top magnetive element 602 whereas a negative pulse is applied through the bottom magnetive element 603. The dark contrast at the magnetive element 603 represents the magnetisation with −Z-direction and the bright contrast at the magnetive element 602 represents the magnetisation with +Z-direction (see FIGS. 2A and 3B for the Z-directions). FIG. 6B shows the Ken microscopy image of the device 600 when the polarity of the current pulses applied through two magnetive elements 602, 603 are reversed, i.e., a negative pulse is applied through the top magnetive element 602 whereas a positive pulse is applied through the bottom magnetive element 603. If the subsequent read or probing currents through both magnetive elements 602, 603 flow parallel to each other, then $V_{H,n}$ at each magnetive elements 602, 603 are of opposite polarities. This results in zero cumulative $V_H$ across the Hall bar 604. However, if the read or probing currents flow anti-parallel to each other, then $V_H$ accumulates. It should be appreciated that whether the "up" or "down" magnetisation state appears black (i.e., dark contrast) or white (i.e., bright contrast) depends on the microscope settings. Only the relative changes can be seen.

There may be various modes of operation. As there are two sets of input information that may be varied—the magnetisation states and/or the read currents may be varied—the logic devices of various embodiments may be operated in two different modes as described in TABLE 1. In each mode of operation, the logic gate is a fixed parameter that defines the function of the logic device, such as AND, XOR, or NOR gates, while the logical inputs vary between "true" and "false" permutations—TT, TF, FT, FF.

TABLE 1

Operating modes of the logic device. Modes I and II are defined by the varying magnetisation states or write schemes, respectively.

| | Mode I | Mode II |
| --- | --- | --- |
| Logic Gate (fixed parameter) | Fixed read scheme $I_{dc,1}$ and $I_{dc,2}$ | Fixed magnetization states $m_1$ and $m_2$ |

TABLE 1-continued

Operating modes of the logic device. Modes I and II are defined by the varying magnetisation states or write schemes, respectively.

| | Mode I | Mode II |
|---|---|---|
| Logical inputs (varying parameter) | Varying magnetization states $m_1$ and $m_2$ | Varying read scheme $I_{dc,1}$ and $I_{dc,2}$ |

In mode I, the device logic gate functionality is determined by the read currents, $I_{dc,n}$, and the magnetisation states $m_1$ and $m_2$ may be varied. The logic functionality of the device may be shown by performing current-driven SOT magnetisation switching in the presence of an externally applied field $H_x=\pm 300$ Oe, for example, provided by an electromagnet. The magnetic field may completely immerse the device in a (uniform) magnetic field along the x-direction (see FIGS. 2A and 3B for the x-direction). In a similar manner as illustrated in FIG. 3A. A large electromagnet provides the field. In various embodiments, $J_n$ may be varied to vary $m_n$. By assuming a positive $\theta_{SH}$ (referring to the spin Hall angle of the heavy metal (e.g., Pt and Ta), which describes how much spin current can be generated due to the charge current delivered, and is a property of the material) in the device multilayer stack disclosed herein, the outcome of the magnetisation state at each channel junction may be summarised as:

$$J_n \cdot H_x > 0 \Rightarrow +m_{z,n} \quad \text{Equation (1);}$$

$$J_n \cdot H_x < 0 \Rightarrow -m_{z,n} \quad \text{Equation (2).}$$

Figure 5:
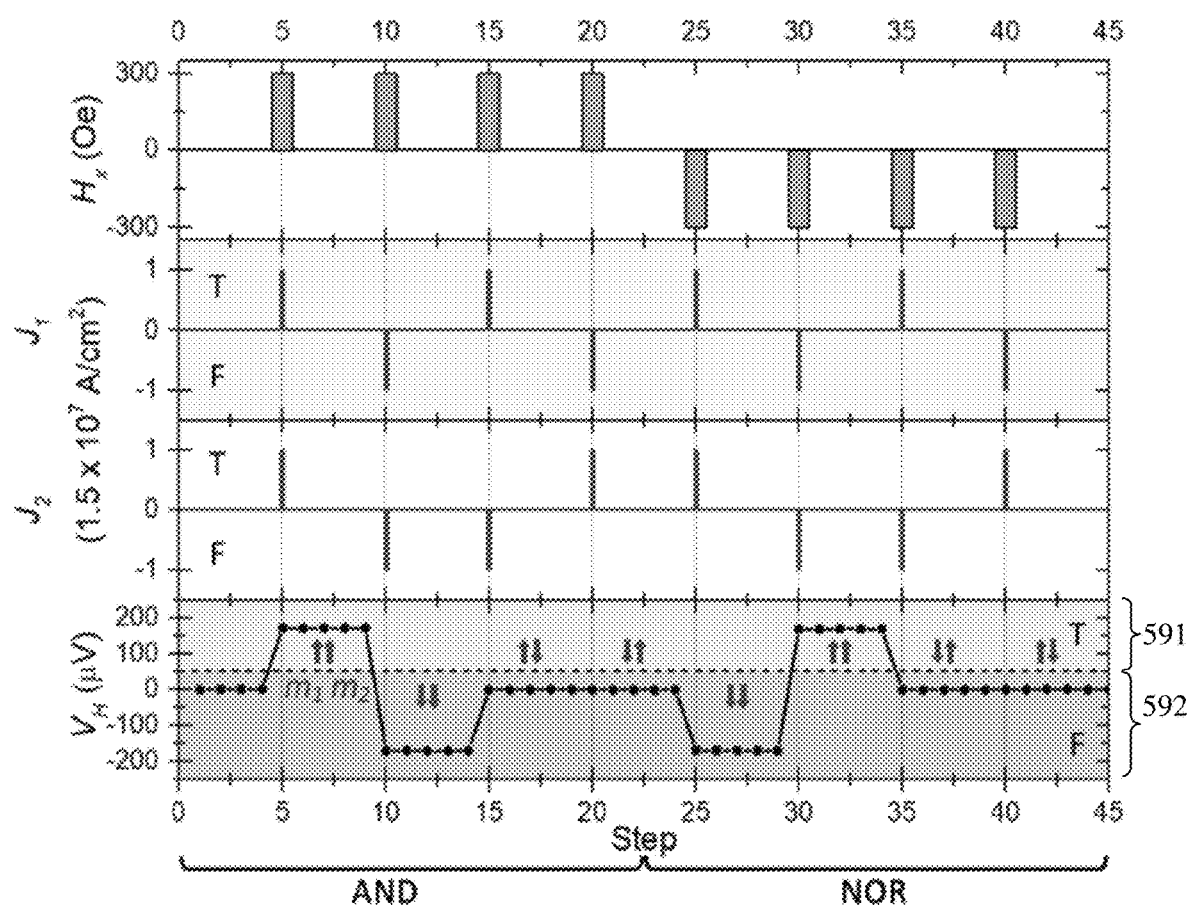
FIG. 5 shows the measurement results for AND and NOR logic operations based on device output for the same sequence of write input parameters at $H_x$=300 Oe followed by $H_x$=−300 Oe.

The logical inputs for the device are represented by Boolean "true" (T) or "false" (F), corresponding to $\pm J_n = \pm 1.5 \times 10^7$ A cm$^{-2}$ through each channel n. FIG. 5 shows the $V_H$ output due to logical inputs TT, FF, TF, and FT for both polarities of $H_x$ of 300 Oe and −300 Oe. The dashed line in the $V_H$ output plot indicates a threshold that may be used to interpret the ternary output of $V_H=\{-200, 0, +200\}$ μV as a Boolean output by half rectification, represented by respective regions 591, 592.

For $H_x=+300$ Oe, logical inputs of TT and FF result in $V_H=+200$ μV and −200 μV, respectively, while both logical inputs of TF and FT result in $V_H \approx 0$ μV. These results lead to the truth table for logical AND. For $H_x=-300$ Oe, the $V_H$ output for each combination of logical inputs is negated, and the truth table of a NOR gate may be obtained. As discussed herein, the cumulative $V_H$ is due to the anomalous Hall voltages formed across each channel junction (or each Hall cross). Due to the identical junction geometry and multilayer structure, as well as the same write and read current amplitudes that result in the same magnetisation states $m_1$ and $m_2$ set at each junction, $|V_{H,1}| \approx |V_{H,2}|$. In mode I, the persistent device magnetisation states may be switched, and the outputs may be recovered by probing the logic devices using the same read scheme. However, while operating in mode I is possible, it may not be energy-efficient to operate the device by repeatedly changing the magnetisation states.

Writing device magnetisation states repeatedly is energy-expensive. In mode II, the device magnetisation is the fixed quantity, and the read scheme may act as the logical inputs. After writing the device magnetisation state once, different outputs may be achieved by varying the logical read inputs.

In the convention used herein, a positive write pulse corresponds to a true Boolean logic input while a negative write pulse corresponds to a false Boolean logic input. The device of various embodiments may demonstrate four possible states due to the two inputs: (a) FF, (b) TT, (c) FT, and (d) TF.

FIGS. 7A to 7D show Kerr microscopy images (obtained using, for example, the MagVision Kerr microscopy system) and truth tables corresponding to the operation of the logic device of various embodiments. A pair of (in-situ) Kerr images and the corresponding truth table are shown in each of FIGS. 7A to 7D. The polarity for each of the probe currents, $I_{probe,1}$ (or $I_{dc,1}$) and $I_{probe,2}$ (or $I_{dc,2}$), corresponds to the Boolean logic, where positive polarity corresponds to true (T) and negative polarity corresponds to false (F). In the Kerr images of FIGS. 7A to 7D, a dark contrast is associated with the up state for the corresponding magnetisation state while a light contrast is associated with the down state for the corresponding magnetisation state.

For each device state (i.e., state of one junction (or one Hall cross)), the probing current polarity is as shown in FIGS. 7A to 7D. A (T) input indicates true, with a positive current pulse (for the probing current) applied through the corresponding nanowire, whereas an (F) input indicates false, with a negative current pulse (for the probing current) applied instead. The write current pulse width to each nanowire may be set at 1 ms, but may be made shorter due to the intrinsically high speed of magnetisation switching as well as to reduce Joule heating. Following each input pulse, simultaneous delivery of a dc probing current $I_{dc}$ (or $I_{probe}$)= 200 μA through each nanowire may allow for the detection of $V_H$ across the Hall bar. The dc probing current may be of smaller amplitude (e.g., $I_{probe}=50$ μA) and scales proportionally to $V_H$ ($V_H=I_{probe} \times R_H$). The devices demonstrate non-volatility as $V_H$ and the state of the device remain unperturbed during multiple measurement processes. Further, the device of various embodiments may not or does not require resetting before performing logic functionality.

The in-situ differential Kerr images in FIGS. 7A to 7D show the four different logic device magnetisation configurations (or logic device magnetic states)—up-up (FIG. 7A), up-down (FIG. 7B), down-up (FIG. 7C), and down-down (FIG. 7D)—where the dark (light) contrast corresponds to the up (down) stare at each junction, where "up" and "down" describe the bistable magnetisation states. Outline of the logic device is shown for visual distinction from the substrate.

For each configuration, the probing inputs, $I_{probe,1}$, $I_{probe,2}$, permutate between TT (true-true state), TF (true-false state), FT (false-true state), and FF (false-false state), where T and F corresponds to $+I_{probe,n}$ (e.g., 200 μA) and $-I_{probe,n}$ (e.g., −200 μA), respectively. Different logic outputs may be achieved by writing with parallel and anti-parallel write currents, reading with parallel and anti-parallel probing currents, followed by interpretation of the device output (i.e., the anomalous Hall voltage, $V_H$). Interpretation may include using half-rectification or full-rectification of the output (e.g., by setting a threshold as described above). The outputs for mode II are summarised in FIGS. 7A to 7D for all four permutations of the logic device magnetisation states. As may be seen, processing to half-rectify ($V_H>0$) or full-rectify ($|V_H|$) the outputs may be implemented to expand the range of logic to include NOR, XNOT, AND, XOR, NIMP (Not-Implication), and converse NIMP (Converse Not-Implication). Therefore, a single logic device of various embodiments may perform multiple logic functions, including but not limited to, AND, NOR, XNOR, XOR, NIMP and/or Converse NIMP, by changing the polarity of the write current, and the probing current directions. When a magnetic field is used, the direction of the magnetic field may also be changed.

As described above, the two modes describe which represents the logic gate: the magnetisation state due to the write current, or the read current. Writing the magnetisation states repeatedly is more energy consuming due to the larger current. By changing the input to the read voltage, the device may still perform logical operations but at a lower power consumption. The two modes described show how either the magnetisation state or the read current as inputs may still yield logical functionality. A field (e.g., local Oersted field) may be provided during the write process in either modes. No field is required if no changes to the magnetisation state are required.

The techniques disclosed herein may enable on-the-fly reconfigurability by bias field line. A method for localizing the necessary $H_x$ to achieve deterministic switching with switching chirality control may allow for selectively manipulating individual logic devices. The term "deterministic switching" (in contrast to stochastic, being the opposite of deterministic) describes the use of a field to enable reliable switching. Without the field, there are challenges that it may not switch unpredictably due to Joule heating. As described above and as shown in FIGS. 3B and 3C, a bias field line 340 that is electrically isolated from the device by a dielectric 344 may generate a large enough Oersted field for magnetisation switching, omitting the need for an externally applied field. As a non-limiting example, the dielectric 344 used may be 200 nm of $HfO_2$ sputtered over a rectangular region, sufficient for electrically isolating the device from the subsequent patterning and deposition of a bias field line 340 having Ti (5)/Cu (150)/Ta (5). The bias field line 340 may be fabricated such that the Oersted field generated along the device channels may be coaxial to J, and the field may not be capable of switching the perpendicularly magnetized states independently. The direction and amplitude of the Oersted field may be tuned by changing the magnitude and polarity of the current $I_{FL}$ running through it. This may offer an on-chip solution to field generation that is local to each device, allowing for reconfigurability without perturbing neighboring devices. The resultant device may have polymorphic logic functionality, meaning that a single device can be transformed to represent one of several possible logic devices. Referring to FIG. 3C, by changing the polarity of $I_{FL}$, the Oersted field along the device channels may be switched between $+\hat{x}$ direction and $-\hat{x}$ direction.

Figure 8:
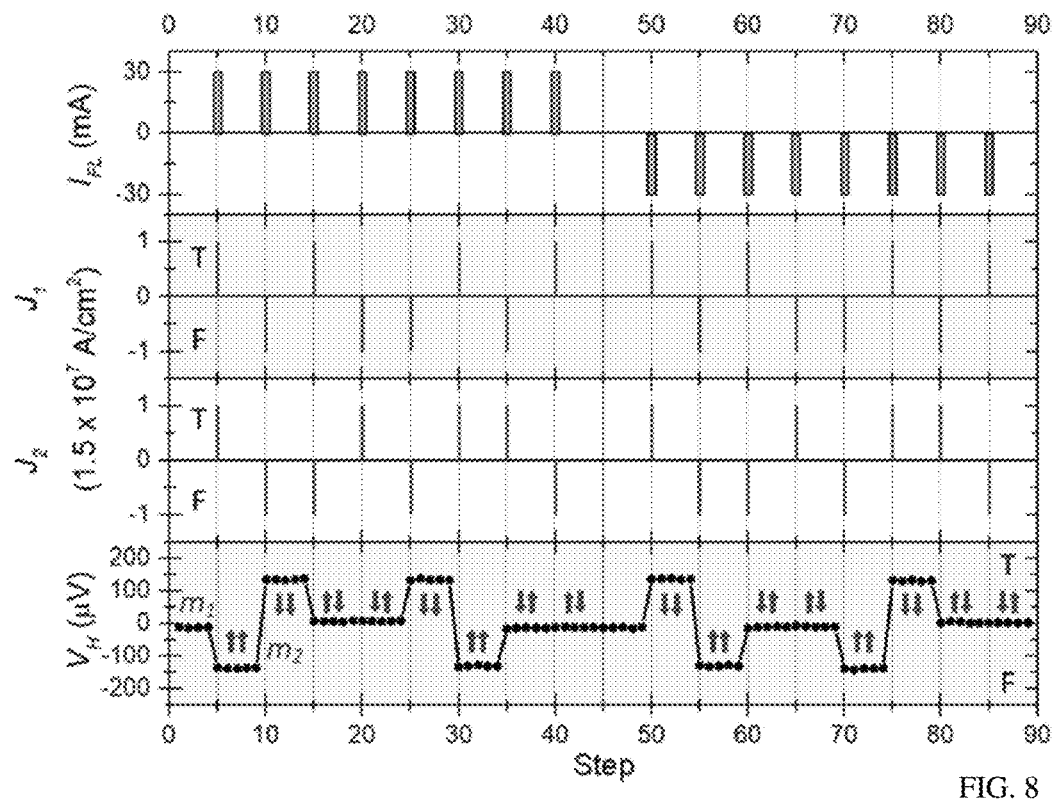
FIG. 8 shows the results for $V_H$ for corresponding inputs of $I_{FL}$, $J_1$, and $J_2$.

A non-limiting example of the logic functionality of the logic device with the integrated bias field line is as described below. First, 30 mA may be applied through the bias field line 340. Then, write current pulses of $J=\pm1.5\times10^7$ A cm$^{-2}$ may be delivered through each channel in the four possible permutations. The current flowing through $I_{FL}$ may be turned off after the write procedure, and $I_{dc}$=100 µA may be delivered through the channels to probe the magnetisation state of the logic device between each set of write current pulses. The additional energy expense for the bias field generation for each write operation is estimated to be under 1 nJ for a 10Ω field line of equivalent 100 ns pulse. Inputs may be supplied as described above, and current through the bias field line 340 may be provided by a second source measure unit (e.g., Keithley 2400). For integrated bias field operation, the device may be situated away from external magnetic field sources. FIG. 8 shows the results for $V_H$ (Hall voltage) for corresponding inputs of $I_{FL}$ (field line current), $J_1$, and $J_2$ (write currents), illustrating the measurement results for the device output for the same series of write input parameters at $I_{FL}$=30 mA and $I_{FL}$=−30 mA. In the device of various embodiments, the magnetisation state may not or does not require initialization. Initialization is a process in which a device needs to be reset to a certain state before writing can occur, which the device of various embodiments may not or does not need for either modes I or II. Initialization is not preferred because it means an added process every time one needs to set the device to a new state, which in turn means extra time and extra energy expense.

Figure 9A:
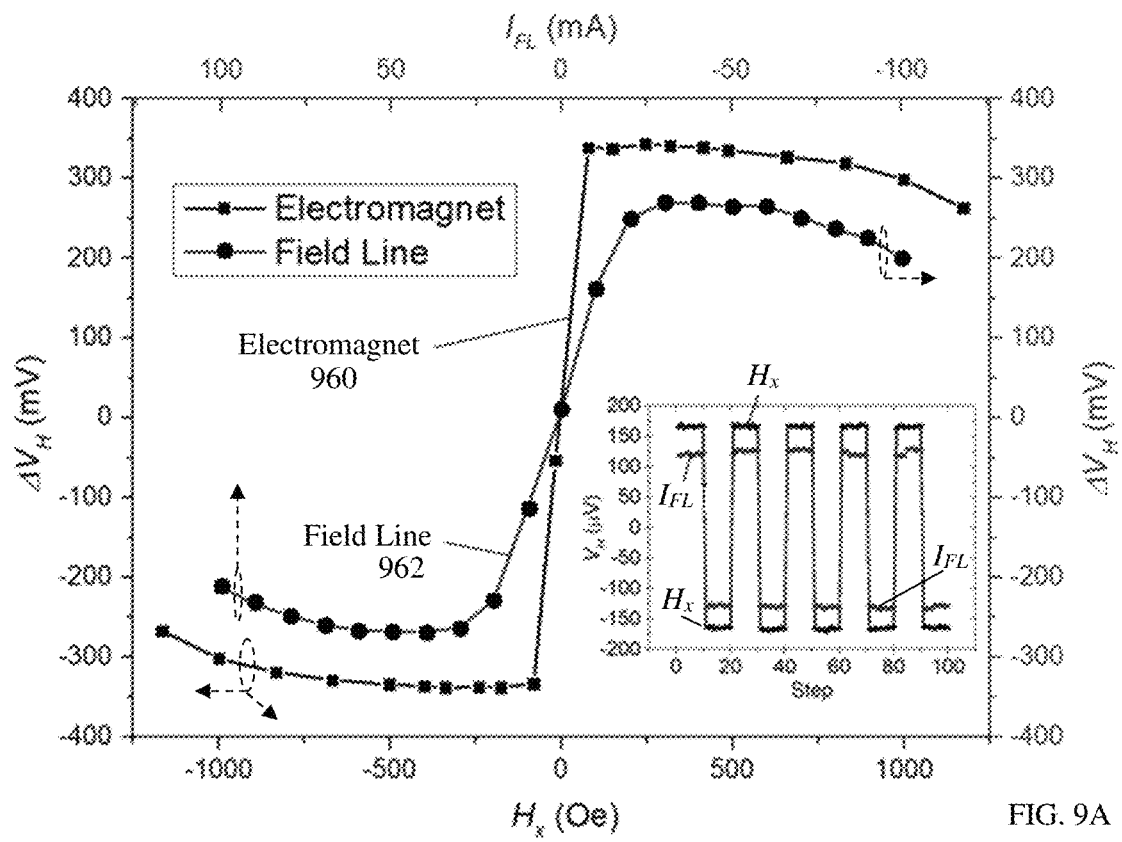
FIG. 9A shows a plot corresponding to comparison of $\Delta V_H = V_H^1 - V_H^1$ between electromagnetic field and field line assisted current-induced magnetisation switching (CIMS).

By utilising a field line (e.g., 340, FIG. 3B), a field line assisted reconfigurable spin-orbit torque logic may be provided. To compare between the externally applied electromagnet field and the local Oersted field assisted current induced magnetisation switching (CIMS), the change in the anomalous Hall voltage $\Delta V_H = V_H^\uparrow - V_H^\downarrow$ may be measured for both methods. Here, $V_H^{\uparrow(\downarrow)}$ represents the anomalous Hall voltage at the up(down) states achieved by CIMS. The range of $I_{FL}$ is from −150 mA to +150 mA, while the externally applied electromagnetic field range is from −1200 Oe to +1200 Oe. A simulation software (e.g., COMSOL) may be used to obtain the Oersted field due to $I_{FL}$ through the field line, with the parameters and dimensions taken from fabrication and measurements. FIG. 9A shows a plot corresponding to comparison of $\Delta V_H = V_H^\uparrow - V_H^\downarrow$ between electromagnetic field (see curve 960) and field line (see curve 962) assisted CIMS. The inset shows $V_H$ for a series of up and down states by CIMS with an external field $H_x$=245 Oe and for $I_{FL}$=−30 mA. The device shows similar behavior as achieved with an externally applied magnetic field, and the bias field line provides the same necessary magnetic field for magnetisation canting with the added feature of allowing individual device programming.

Figure 9C:
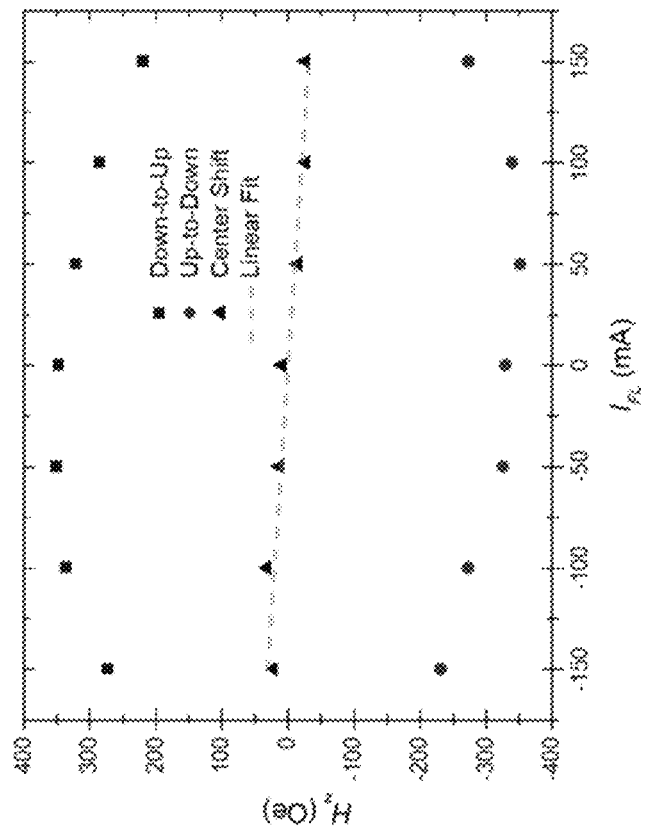
FIGS. 9B and 9C show $R_H$ in a sweeping out-of-plane (OOP) field $H_z$.
Figure 9B:
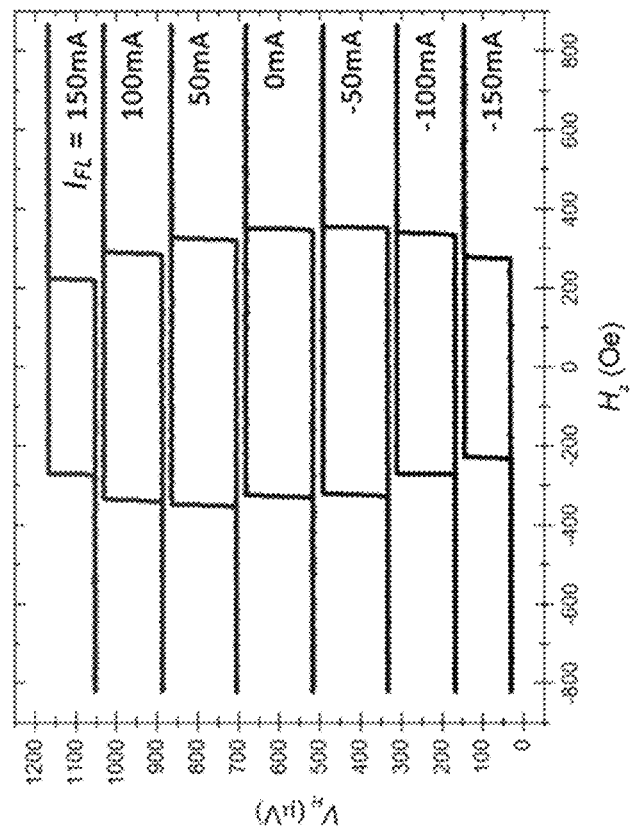

The curves 960, 962 are similar, except for the shallower gradient at the ow-field linear region and where $|I_{FL}|<30$ mA, as well as reduced $\Delta V_H$ in devices with the integrated field line. This may be attributed to thermal effects due to $I_{FL}^2$, as well as the field line not generating a local Oersted field purely coaxial to the x-axis. This may be seen in FIG. 9B, where it may be observed that there is thermally induced reduction in coercivity at larger amplitudes of $I_{FL}$ regardless of polarity, indicating thermal effects from current through the field line. The slight center shift in hysteresis with $I_{FL}$ at about 0.2 Oe/A indicates a non-zero out-of-plane (OOP) field contribution due to $I_{FL}$ being present, as shown in FIG. 9C, and likely due to uneven film growth when the field line and passivation are overlaid on the device. However, these issues do not critically impact the performance of the logic device as the $V_H$ signal-to-noise ratio is large and distinguishable. As such, the non-zero OOP field due to $I_{FL}$ may not or does not affect the device functionality.

A compact model of a reconfigurable spin orbit torque logic device may be as described below. A half-adder may be demonstrated by constructing a SPICE-compatible compact model of the device of various embodiments, the model being realised using a modular approach. In this formalism, different spintronic phenomena are represented by elemental circuit modules, which may then be combined to model device behavior.

Three pieces of device physics may be necessary for the modelling of each of the multilayer Hall cross device: i) charge to spin conversion by the spin Hall effect (SHE), ii) magnetisation dynamics governed by the Landau-Lifshitz-Gilbert (LLG) equation, and iii) magnetisation state readout by the anomalous Hall effect (AHE). The circuit models of these three phenomena are shown in FIGS. 10A to 10C, with their modular representations being shown under their respective circuit representations.

FIG. 10A shows the SHE circuit model 1080 and is equivalent to solving the charge and spin diffusion equations together with the generalised Ohm's law used to quantify spin Hall phenomena. The SHE circuit 1080 is represented by a coupled charge circuit 1081 which models the motion of charge current in the longitudinal direction and a spin circuit 1082 which models the motion of spin current in the transverse direction. The two circuits 1081, 1082 are coupled by current sources, which represent conversion between charge and spin currents via the SHE and the inverse spin Hall effect (ISHE). The charge circuit 1081 between the terminals 1c and 2c contains a series conductance $G_0$ and two current sources $I_{0c}$ which represent spin-to-charge conversion via the inverse spin Hall effect (ISHE). The spin circuit 1082 between the terminals 3y and 4y includes a series conductance $G_{2y}$, shunt conductances $G_{1y}$ which represent spin current attenuation via spin-flip processes, and current sources $I_{0y}$ which represent charge to spin conversion by the SHE.

FIG. 10B shows a model 1083 having capacitor-current source circuits 1084a, 1084b, 1084c which represent the LLG equation. Magnetisation components $m_x$, $m_y$ and $m_z$ are represented as node voltages.

The LLG equation may be defined as $$\frac{d\vec{m}}{dt} = -\gamma\mu_0\vec{m}\times\vec{H}_{eff} + \alpha\vec{m}\times\frac{d\vec{m}}{dt} + \frac{\gamma\hbar}{2eM_sV}\vec{m}\times(\vec{m}\times I_{sy}\hat{y}),$$ Equation (3)

where $\vec{m}$ is the unit magnetisation, $\vec{H}_{eff}$ is the effective field which includes external field and uniaxial anisotropy field terms, $\alpha$ is the Gilbert damping coefficient, $\gamma$ is the gyromagnetic ratio, $M_s$ is the saturation magnetisation of the ferromagnetic (FM) layer and V is its volume, $\mu_0$ refers to the vacuum permeability, and h refers to the reduced Planck's constant. The vector triple product on the right-hand side is the damping-like (DL) torque caused by an incident pure spin current of magnitude $I_{sy}$ and polarization Y. The corresponding circuit model 1083 in FIG. 10B includes capacitor-current source circuits 1084a, 1084b, 1084c where the node voltage corresponds to the components of $\vec{m}$. The implementation may reproduce the dynamics of a single domain ferromagnet in accordance with Equation (3).

FIG. 10C shows a voltage source circuit representation of the AHE 1085 where $V_{AHE} \propto I_c M_z$. The AHE 1085 is represented by a voltage source 1086. The anomalous Hall voltage, $V_{AHE}$, generated due to small read current $I^c$ may be given by the following:

$$V_{AHE} = \frac{R_s M_s I_c}{t_{FM}} m_z.$$ Equation (4)

where $R_s$ is the anomalous Hall coefficient, $M_s$ is the saturation magnetisation of the FM layer, and $t_{FM}$ is its thickness. As $V_{AHE} \propto m_z I_c$, the transverse voltage generated by the AHE has a polarity determined by the sign of m for a given read current $I_c$. This allows for the simulation of magnetisation state read-out within a circuit simulator. The derivation of Equation (4) (i.e., the Anomalous Hall Effect (AHE) generated voltage $V_{AHE}$) may be done as described below.

Consider a bilayer system 1190 with a normal metal (NM) layer 1191 and a ferromagnetic (FM) layer 1192 with perpendicular magnetic anisotropy (PMA), as shown in FIG. 11. Charge current $I_c$ is injected to both the NM layer 1191 and the FM layer 1192. The anomalous Hall effect (AHE) generates a transverse voltage $V_{AHE} \propto m_z I_c$ which may be used to readout the magnetisation state. The transverse conductivity of the system 1190 may be given by $$\rho_{xy} = R_0 H_z + R_s M_z$$ Equation (5), where $R_0$ and $R_s$ are coefficients for the Classical Hall Effect (CHE) and the AHE respectively. In the system above, there is no external magnetic field applied, i.e., $H_z=0$, and the injected charge current is a small probing current which does not perturb the magnetisation. Hence, Equation (5) reduces to $$\rho_{xy} = R_s M_s m_z$$ Equation (6), where $M_z = M_s m_z$ and $M_s$ is the saturation magnetisation.

Next, an electric field pointing in the y direction due to a charge current density flowing in the x direction may be considered:

$$E_y = \rho_{yx} J_x$$ Equation (7).

The current density is then converted to a current by multiplying and dividing the RHS (right hand side) of Equation (7) with the cross-sectional area of the FM layer 1192, $a=wt_{FM}$. Also, $\rho_{yx}=-\rho_{xy}$ just as in the CHE. Equation (8) may be obtained.

$$E_y = -\frac{\rho_{xy}}{wt_{FM}} I_c.$$ Equation (8)

It is then assumed that the electric field $E_y$ is constant along the y-direction. It may therefore be written as the potential difference of the transverse terminals divided by w. The transverse potential difference would be given by the AHE generated voltage with respect to ground, in accordance with FIG. 11. Equation (9) may be obtained.

$$E_y = -\frac{\partial V(y)}{\partial y} = \frac{-(V_{AHE} - 0)}{w}.$$ Equation (9)

Equations (6) and (9) may then be substituted into Equation (8), leading to Equations (10) and (11) below.

$$\frac{V_{AHE}}{w} = \frac{R_s M_s m_z}{wt_{FM}} I_c,$$ Equation (10)

$$V_{AHE} = \frac{R_s M_s}{t_{FM}} m_z I_c.$$ Equation (11)

Equations (10) and (11) show that $V_{AHE} \propto m_z I_c$, which reflects that the polarity of the AHE generated voltage depends on whether $m_x>0$ or $m_x<0$ for a given charge current injection $I_c$.

Referring back to FIGS. 10A to 10C, the SHE module 1080 accepts charge current inputs through its 1c and 2c terminals and outputs y-polarized spin current through its 3y and 4y terminals. The LLG module 1083 accepts spin current $I_{sy}$ and the external field $\vec{H}_{exi}$ as inputs, and outputs the unit magnetisation $\vec{m}$. The AHE module 1085 accepts $m_z$ and the charge current flowing through the FM layer as inputs and outputs the transverse voltage $V_{AHE}$ according to Equation (4).

The three modules 1080, 1083, 1085 may be used to construct a compact model 1088 of the (multilayer) Hall cross device of various embodiments, as shown in FIG. 10D.

Parameters used for the compact model are shown in FIG. 12 illustrating the material and geometric parameters for each module.

As described herein, the device may include a Ta (5)/Pt (3)/[Co (0.6)/Pt (0.6)]3/Co (0.6)/Ta (5) multilayer stack. The HM layers may be modelled using the SHE module 1080 while the FM layer may be modelled using the LLG module 1083 and resistance $R_{FM}$. Therefore, the Ta and Pt layers may be modelled respectively as "Tantalum SHE" modules 1080a and "Platinum SHE" module 1080b, while the [Co/Pt]$_3$/Co multilayer may be approximated as a bulk FM layer with perpendicular anisotropy, and modelled using the LLG module 1083 with charge current resistance $R_{FM}$. The SHE modules 1080a, 1080b and REM are connected in parallel to approximate the current flow through the HM and FM layers. Upon passing a charge current between terminals 1 and 2, the HM layers generate a spin current which is then fed to the LLG module 1083 via the spin current line 1087. An external field $\vec{H}_{ext}$ may also be specified and passed to the LLG module 1083 as an input. The LLG module 1083 may then calculate the trajectory $\vec{m}(t)$. The z-component of the magnetisation $m_z$ from the LLG module 1083 as well as the charge current flowing through the FM layer $I_{FM}$ (or $I_c$) may then be supplied as inputs to the AHE module 1085. The AHE module 1085 may then generate, as an output, a transverse voltage $V_{AHE}$ based on Equation (4), which may be measured using nodes 3 and 4. The compact model 1088 schematic in FIG. 10D may be treated as a subcircuit with four nodes, representing a single Hall cross in which charge current may be passed between nodes 1 and 2. This charge current may be used to write magnetisation states via torque resulting from SHE or to sense magnetisation states by measuring the voltage due to AHE across nodes 3 and 4.

A half-adder circuit 1070 may be constructed as shown in FIG. 10E. The circuit 1070 may include two logic devices 1071a, 1071b. Each logic device 1071a, 1071b may be defined or modelled by two Hall crosses—first/upper cross 1006a, 1006c and second/lower cross 1006b, 1006d—with their AHE voltage sources arranged in series with each other. The two logic devices 1071a, 1071b may have magnetisation configurations and rectification circuits (full rectification circuit 1074, half rectification circuit 1076) that yield the logical outputs of an XOR gate and an AND gate respectively. The arrows in the Hall crosses 1006a, 1006b, 1006c, 1006d represent the magnetisation state of the Hall crosses 1006a, 1006b, 1006c, 1006d, where an ↑ indicates $m_z>0$ and ↓ indicates $m_z<0$. The half-adder circuit 1070 may include an XOR gate and an AND gate defined by the magnetisation states of each logic device 1071a, 1071b in accordance with operating mode II. Current sources are wired to the devices 1071a, 1071b. The two logic devices 1071a, 1071b are connected in series, such that the current inputs (e.g., input current pulses) $I_1$ and $I_2$ are concurrently delivered across the upper and lower Hall crosses 1006a, 1006b, 1006c, 1006d of each logic device 1071a, 1071b, respectively. The correlation between the compact model 1088 (FIG. 10D) to the symbolic representation of FIG. 10E is indicated by the dashed box for the Hall cross 1006a.

In the arrangement shown in FIG. 10E, the logical inputs to both devices 1071a, 1071b are read current pulses and the logical outputs are rectified AHE voltages. The XOR and AND gates generate the SUM and CARRY outputs, respectively. In order to obtain the correct logic functionality, the two devices 1071a, 1071b may be set to the correct magnetisation configurations. Logic device 1 1071a may be initialised with its upper Hall cross 1006a in the "down"

($m_z<0$) state and its lower Hall cross 1006b in the "up" ($m_z>0$) state. The total transverse AHE voltage generated by logic device 1 1071a may then undergo amplification and full-wave rectification, via circuit 1074, in order to obtain the correct logical output. Similarly, logic device 2 1071b may be initialised with both Hall crosses 1006c, 1006d in the "up" state and its total transverse AHE voltage may undergo amplification and half-wave rectification, via circuit 1076.

Referring to FIG. 10F, the half-adder functionality may be carried out by cycling through the four possible logical input combinations. Logical inputs are delivered by $I_1$ and $I_2$ as exponential pulses with 3 ns pulse widths and 1 mA pulse amplitudes. The positive pulses are interpreted as logical 1s and the negative pulses are interpreted as logical 0s. The SUM and CARRY outputs are shown in the two bottom panels of FIG. 10F. The output voltages close to zero are interpreted as logical 0 and the positive voltages are interpreted as logical 1. Hence, it may be observed that the circuit 1070 of FIG. 10E functions as a half-adder.

The logic devices of various embodiments may be used as elements in larger systems with other applications. Also, as each device may be reconfigured by magnetisation switching, the design shown in FIG. 10E may be made more flexible by adding a suitable multiplexer between the Hall cross devices 1006a, 1006b, 1006c, 1006d and the rectification circuits 1074, 1076. Such a design may expand the functionality of the circuit shown in FIG. 10E and may allow for greater flexibility during operation.

As described above, various embodiments may provide a magnetic logic device of perpendicular magnetisation, having two channels (nanowires) connected by a perpendicular Hall bar. In a write operation, a respective write current (e.g., $J_1$, $J_2$) may be provided to each channel. Different polarities of each respective write current may be provided for switching the magnetisation state of the respective channel between the "up" and "down" state. In a read operation, a respective read or probe current (e.g., $I_{probe,1}$, $I_{probe,2}$) may be provided to each channel Different polarities of each respective read current may be provided to the respective channel. An anomalous Hall voltage, $V_H$, is generated across the Hall bar, as an output. $V_H$ is dependent on the read currents and the magnetisation states of the two channels. In all devices, a method to cant or skew the magnetisation may be required, only for the write operation, for switching the magnetisation of the relevant channel from "up" to "down", or vice versa. This method may be one of (i) Technique A: a field-associated method (e.g., an external magnetic field provided by an electromagnet, or a local Oersted field provided via a bias field line), or (ii) Technique B: a field-free method (e.g., exchange coupling with an AFM or iFM layer, or via voltage-controlled magnetic anisotropy (VCMA)). Techniques A and B may define means for skewing the magnetisation state of each of the two channels (nanowires) away from the perpendicular easy axis.

When using the Technique A, during the write process, the magnetisation of the relevant channel may be switched between "up" and "down" depending on the polarity/direction of the write current and the direction of the field. In all devices, during mode I operation, for the device to perform different logic functionalities, the read currents are fixed, and the polarities of the write currents are varied, which, together with the method to cant or skew the magnetisation, lead to switching the magnetisation states from "up" to "down", or vice versa. During mode I operation, when using Technique A, it is possible to vary the polarities of the write currents and/or the direction of the field to switch the magnetisation states. During mode I operation, when using Technique B, it is possible to vary only the polarities of the write currents to switch the magnetisation states. In all devices, during mode II operation and when using either Technique A or Technique B, for the device to perform different logic functionalities, the magnetisation states are maintained, and the polarities of the read currents are varied. The magnetisation states are fixed by being "written" once via the write process in combination with either Technique A or Technique B.

The device of various embodiments is capable of reconfigurability—the device may switch to operate as one of the following logic gates: NOR, XNOR, AND, XOR, NIMP, and Converse NIMP—by exploiting the effect of magnetisation switching due to the polarity of the field applied and read current direction, and interpretation of the magnetisation state due to the write current direction. The device input may either be due to i) write current, in which magnetisation states are varied, or ii) read current, in which read current is varied. Thresholds along with half-rectification or full-rectification may be used to achieve different read-outs for the logic functionalities described herein.

As described herein, various embodiments may provide a reconfigurable spin-orbit torque driven logic device, including, for example, a reconfigurable spin-orbit torque driven logic device with an integrated bias field line. The performance of the logic device is similar with respect to an external magnetic field generated by an electromagnet, and to a local Oersted field by an integrated bias field line for each logic device, demonstrating the viability of locally controlling the parameters for magnetisation switching for each device. The locally generated bias field may enable chirality control of the current-induced magnetisation switching, allowing the device to perform various logic gate functions. The device may logically output AND, NOR, XNOR, XOR, NIMP, and converse NIMP, using either of two operating modes. The first mode (mode I) may be write- and energy-intensive, and may be useful for applications requiring the encoding of data for long term memory storage. The second mode (mode II) may be more energy-conservative, where the device states that determine the logic gate function are written once. A compact model of the logic device may be used to demonstrate the logic functionality for half-adder operations. As described, mode II has been demonstrated in a SPICE-compatible compact modelling of the logic in a half-adder application. Spintronic-based computation by SOT switching according to the techniques disclosed herein has the potential to lead to low power and high speed spintronic circuits logic and computation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A magnetic logic device comprising:
   two magnetic elements,
   wherein the magnetic logic device is configured, for each of the two magnetic elements, to have a magnetization state with a perpendicular easy axis, and configured to switch the magnetization state in response to a spin current generated in the magnetic element in response to a write current applied to the magnetic element; and
   a conductive element coupled to the two magnetic elements and arranged at least substantially perpendicular to the two magnetic elements,
   wherein the magnetic logic device is configured to generate, as an output, a Hall voltage across the conductive element in response to a respective read current applied to each of the two magnetic elements, wherein a magnitude of the Hall voltage is variable, depending on a direction of the magnetization state of each of the two magnetic elements and a direction of the respective read current applied to each of the two magnetic elements, for the magnetic logic device to provide outputs corresponding to one of a plurality of logical operations.

2. The magnetic logic device as claimed in claim 1, wherein in one mode of operation, for each of the two magnetic elements,
   the direction of the respective read current is fixed, and the magnitude of the Hall voltage is variable in response to a change in a direction of the write current applied to the magnetic element to change a polarity of the spin current to switch the magnetization state.

3. The magnetic logic device as claimed in claim 1, wherein in a further mode of operation, for each of the two magnetic elements,
   the magnetization state is maintained, and the magnitude of the Hall voltage is variable in response to a change in the direction of the respective read current applied to the magnetic element.

4. The magnetic logic device as claimed in claim 1, further configured to skew the magnetization state of each of the two magnetic elements away from the perpendicular easy axis for the magnetic element to switch the magnetization state in response to the spin current.

5. The magnetic logic device as claimed in claim 4,
   configured to skew the magnetization state by generating a magnetic field across the two magnetic elements using an electromagnet, or
   configured to skew the magnetization state by, for each of the two magnetic elements, arranging an electrode and a dielectric layer between the electrode and the magnetic element, and, wherein the magnetic logic device is configured so that, in response to a voltage applied to the electrode, an electric field is generated in the dielectric for tuning a magnetic anisotropy of the magnetic element.

6. The magnetic logic device as claimed in claim 4, configured to skew the magnetization state by disposing a conductive field bias line adjacent to the two magnetic elements, and the magnetic logic device is configured for the conductive field bias line to generate an Oersted field to interact with the two magnetic elements.

7. The magnetic logic device as claimed in claim 6, wherein, for each of the two magnetic elements, the magnetic element is configured to switch the magnetization state in response to the spin current and the Oersted field, wherein the direction of the magnetization state after switching is dependent on a polarity of the write current and a direction of the Oersted field.

8. The magnetic logic device as claimed in claim 4, wherein each of the two magnetic elements comprises a ferromagnetic layer, and the magnetic logic device is configured to skew the magnetization state by forming each of the two magnetic elements with an antiferromagnetic layer or an in-plane ferromagnetic layer for exchange coupling with the ferromagnetic layer.

9. The magnetic logic device as claimed in claim 8, wherein, for each of the two magnetic elements, the magnetic element further comprises a non-magnetic material between the ferromagnetic layer and the antiferromagnetic layer or the in-plane ferromagnetic layer.

10. The magnetic logic device as claimed in claim 1, further comprising a rectification circuit electrically coupled to the conductive element to rectify the Hall voltage.

11. A circuit comprising:
a first magnetic logic device and a second magnetic logic device electrically coupled to each other, each of the first magnetic logic device and the second magnetic logic device is as claimed in claim 1,
wherein the first magnetic logic device is configured to provide outputs corresponding to an XOR logical operation, and
wherein the second magnetic logic device is configured to provide outputs corresponding to an AND logical operation.

12. A method for controlling a magnetic logic device comprising two magnetic elements and a conductive element coupled to the two magnetic elements and arranged at least substantially perpendicular to the two magnetic elements, wherein the magnetic logic device is configured, for each of the two magnetic elements, to have a magnetization state with a perpendicular easy axis, the method comprising:
skewing the magnetization state of each of the two magnetic elements away from the perpendicular easy axis for switching the magnetization state;
for each of the two magnetic elements, applying a write current to the magnetic element to generate a spin current in the magnetic element to switch the magnetization state; and
applying a respective read current to each of the two magnetic elements for the magnetic logic device to generate, as an output, a Hall voltage across the conductive element, wherein a magnitude of the Hall voltage is variable, depending on a direction of the magnetization state of each of the two magnetic elements and a direction of the respective read current applied to each of the two magnetic elements, for the magnetic logic device to provide outputs corresponding to one of a plurality of logical operations.

13. The method as claimed in claim 12, wherein, in one mode of operation, for each of the two magnetic elements, the direction of the respective read current is fixed and the method comprises changing a direction of the write current applied to the magnetic element to change a polarity of the spin current to switch the magnetization state, wherein the magnitude of the Hall voltage is variable in response to the change in the direction of the write current.

14. The method as claimed in claim 12, wherein, in a further mode of operation, for each of the two magnetic elements, the magnetization state is maintained and the method comprises changing the direction of the respective read current, wherein the magnitude of the Hall voltage is variable in response to the change in the direction of the respective read current.

15. The method as claimed in claim 12, wherein skewing the magnetization state of each of the two magnetic elements away from the perpendicular easy axis comprises generating, using an electromagnet, a magnetic field across the two magnetic elements.

16. The method as claimed in claim 12, wherein skewing the magnetization state of each of the two magnetic elements away from the perpendicular easy axis comprises applying a field current to a conductive field bias line adjacent to the two magnetic elements to generate an Oersted field to interact with the two magnetic elements.

17. The method as claimed in claim 16, further comprising changing a direction of the field current to change a direction of the Oersted field.

18. The method as claimed in claim 12, wherein skewing the magnetization state of each of the two magnetic elements away from the perpendicular easy axis comprises, for each of the two magnetic elements, applying a voltage to an electrode arranged adjacent to the magnetic element to generate an electric field in a dielectric arranged between the electrode and the magnetic element for tuning a magnetic anisotropy of the magnetic element.

19. The method as claimed in claim 12, further comprising rectifying the Hall voltage.

20. A method for controlling a circuit comprising:
operating a first magnetic logic device of the circuit according to the method as claimed in claim 12 to provide outputs corresponding to an XOR logical operation; and
operating a second magnetic logic device of the circuit according to the method as claimed in claim 12 to provide outputs corresponding to an AND logical operation,
wherein the first magnetic logic device and the second magnetic logic device are electrically coupled to each other.

* * * * *